United States Patent
Cader et al.

(10) Patent No.: US 11,497,137 B2
(45) Date of Patent: Nov. 8, 2022

(54) METHOD AND APPARATUS FOR EXTENDED SERIAL TEMPERATURE CONTROL IN A COMPUTE DEVICE

(71) Applicant: HEWLETT PACKARD ENTERPRISE DEVELOPMENT LP, Houston, TX (US)

(72) Inventors: Tahir Cader, Liberty Lake, WA (US); Harvey J. Lunsman, Chippewa Falls, WI (US); Mitchell Johnson, Madison, WI (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 21 days.

(21) Appl. No.: 17/126,361

(22) Filed: Dec. 18, 2020

(65) Prior Publication Data
US 2022/0201894 A1 Jun. 23, 2022

(51) Int. Cl.
*H05K 7/20* (2006.01)
*G06F 1/20* (2006.01)

(52) U.S. Cl.
CPC ........... *H05K 7/20218* (2013.01); *G06F 1/20* (2013.01); *H05K 7/2039* (2013.01)

(58) Field of Classification Search
CPC ......... H01L 23/427; G06F 1/20; G06F 1/203; G06F 2200/201; H05K 7/20336; H05K 1/0203; H05K 7/2039; H05K 7/20936; H05K 7/20672; H05K 7/20254; H05K 7/20309; H05K 7/20809; H05K 7/205
See application file for complete search history.

(56) References Cited

U.S. PATENT DOCUMENTS

| | | | |
|---|---|---|---|
| 5,023,695 A * | 6/1991 | Umezawa | H01L 23/4735 257/714 |
| 7,933,125 B2 * | 4/2011 | Wei | H05K 7/20772 361/708 |
| 7,936,560 B2 | 5/2011 | Toyoda et al. | |
| 7,957,132 B2 | 6/2011 | Fried | |
| 8,913,384 B2 * | 12/2014 | David | H05K 13/00 361/721 |
| 9,282,678 B2 | 3/2016 | Campbell et al. | |
| 9,867,315 B2 | 1/2018 | Berk et al. | |
| 2003/0200762 A1 * | 10/2003 | Nakano | F25B 5/04 257/E23.098 |

(Continued)

OTHER PUBLICATIONS

Watts, D., "ThinkSystem SD650 Direct Water Cooled Server (Xeon SP Gen 1)," Jul. 23, 2019, https://lenovopress.com/lp0636-thinksystem-sd650-direct-water-cooled-server-xeon-sp-gen-1.

*Primary Examiner* — Adam B Dravininkas
(74) *Attorney, Agent, or Firm* — Nolte Intellectual Property Law Group

(57) ABSTRACT

A compute device includes a printed circuit board, at least three compute subassemblies disposed on the printed circuit board, and a liquid loop. The compute subassemblies disposed on the printed circuit board and each of the three compute subassemblies includes a thermal control plate defining a respective internal conduit therethrough. A temperature controlled liquid circuit circulates through the liquid loop through to control the temperature of each of compute subassemblies in series during operation, the liquid loop including each of the internal conduits in each of the thermal control plates in each of the compute subassemblies.

20 Claims, 20 Drawing Sheets

(56) References Cited

U.S. PATENT DOCUMENTS

2008/0163631 A1* 7/2008 Campbell ................. G06F 1/20
                                                            62/175
2010/0025010 A1* 2/2010 Cipolla ............... H01L 23/4093
                                                            165/47
2012/0020022 A1* 1/2012 Peterson ............ H01L 23/4093
                                                            361/699

* cited by examiner

METHOD AND APPARATUS FOR EXTENDED SERIAL TEMPERATURE CONTROL IN A COMPUTE DEVICE

STATEMENT REGARDING FEDERALLY SPONSORED RESEARCH OR DEVELOPMENT

This invention was made with Government support under Agreement Number H98230-81-3-0001. The Government has certain rights in the invention.

CROSS-REFERENCE TO RELATED APPLICATIONS

Not applicable.

BACKGROUND

This section of this document introduces information about and/or from the art that may provide context for or be related to the subject matter described herein and/or claimed below. It provides background information to facilitate a better understanding of the various aspects of the presently disclosed technique. Accordingly, this is a discussion of "related" art. That such art is related in no way implies that it is also "prior" art. The related art may or may not be prior art. The discussion in this section of this document is to be read in this light, and not necessarily as admissions of prior art.

Operating temperature affects the operability and efficiency of computing devices. In large, powerful computing devices with high densities of heat generating electronic components, heat disposal and cooling of those electronic components may be a priority. Additionally, some computing devices may be deployed in rugged and/or hostile environments that include harsh extremes of temperature. These extremes may include not only undesirably high temperatures but may also include undesirably low temperatures. Still further, there are applications in which a computing device may need to warm up before use or perhaps even be warmed during operation.

BRIEF DESCRIPTION OF THE DRAWINGS

The presently disclosed technique may be understood by reference to the following description taken in conjunction with the accompanying drawings, in which like reference numerals identify like elements, and in which:

FIG. 2A-FIG. 2B are exploded, perspective views of the first side of the thermal control apparatus of FIG. 1A-FIG. 1D from two different perspectives. FIG. 2C is an exploded, perspective view of the second side of the thermal control apparatus.

FIG. 3A-FIG. 3B are a perspective view and a plan view, respectively, of the first side of the thermal control plate.

FIG. 3C-FIG. 3D are a perspective view and a plan view, respectively, of the second side of a thermal control plate.

FIG. 5A-FIG. 5B are an assembled and an exploded view, respectively, of the first side of the heat transfer devices, bracket, and heat transfer plate. FIG. 5C-FIG. 5D are assembled, plan views of the first side and the second side, respectively, of the heat transfer devices, bracket, and heat transfer plate.

FIG. 12A-FIG. 12B are a perspective and a plan view, respectively, of a first side of the thermal control plate. FIG. 12C-FIG. 12D are a perspective and a plan view, respectively, of a second side of the thermal control plate.

Figure 1A:
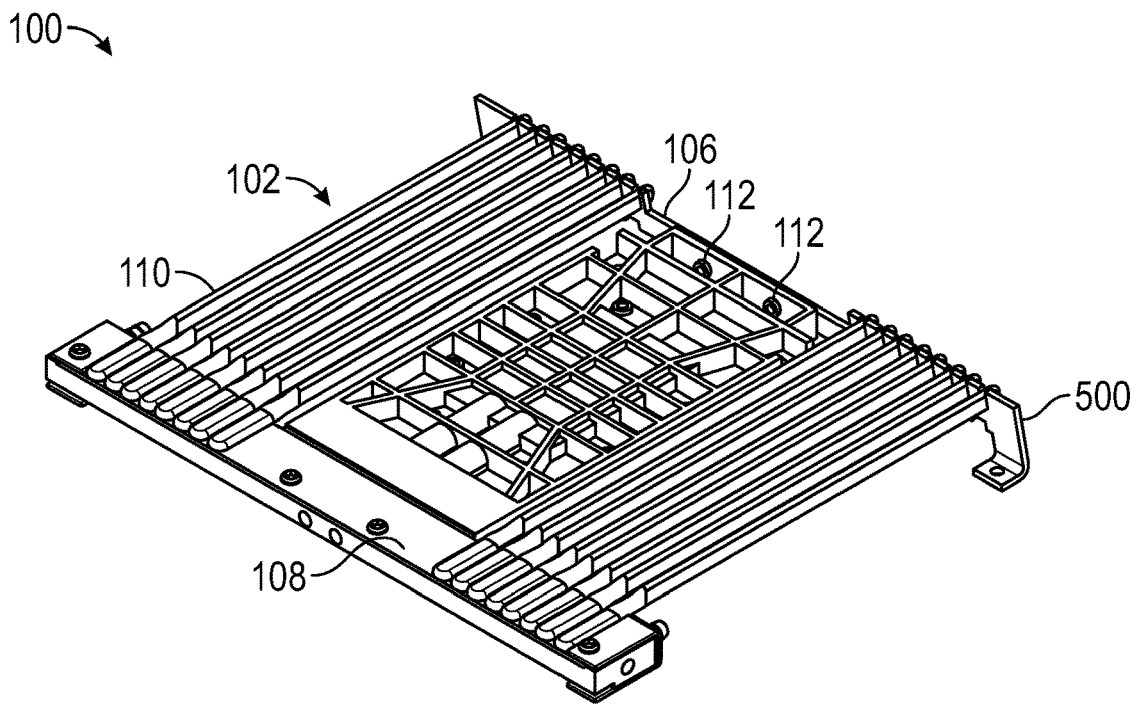
FIG. 1A-FIG. 1D are assembled, perspective views of a first side and a second side, respectively, and assembled, plan views of a first side and a second side, respectively, of a thermal control apparatus in accordance with one or more examples.

While the techniques disclosed herein is susceptible to various modifications and alternative forms, the drawings illustrate specific examples herein described in detail by way of example. It should be understood, however, that the description herein of specific examples is not intended to limit the disclosed technique to the particular forms disclosed, but on the contrary, the intention is to cover all modifications, equivalents, and alternatives falling within the spirit and scope of the appended claims.

DETAILED DESCRIPTION

Illustrative examples of the subject matter claimed below will now be disclosed. In the interest of clarity, not all features of an actual implementation are described in this specification. It will be appreciated that in the development of any such actual example, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

On the whole, thermal control in computing devices is generally driven by the need to cool electronic components that generate heat through power consumption. Processing units, application specific integrated circuits ("ASICs"), and memory module power consumption continues to rise. Motherboards are packaged with increasing numbers of heat generating components such that total motherboard power levels concomitantly continue to climb. Some top-end, high performance compute ("HPC") servers already operate at power levels reaching as much as 2.5 kW and it is expected that future servers will achieve even higher levels of power consumption.

As device power levels increase, more cooling capacity will be desired and may be achieved in a number of ways. Approaches may include lowering coolant temperatures, delivering more coolant, or even cooling each high-power device with a dedicated cooling loop in a multi-socket server. However, lowering coolant temperature is generally considered undesirable as warmer water enables chiller-less cooling and waste heat re-use. As flow rates increase, or if each device is cooled with a dedicated cooling loop, the plumbing may get more complicated, costly, heavy, and difficult to assemble.

Some HPC servers use liquid cooling to manage these types of thermal concerns. Currently used liquid cooling techniques cool, at most, two compute subassemblies in series and so employ multiple parallel liquid cooling loops. For present purposes, a "compute subassembly" is a set of processing and memory resources. Many servers include four compute subassemblies, thereby requiring a minimum of two parallel liquid cooling loops. Some HPC servers provide a dedicated loop for each compute subassembly, thereby increasing the number of parallel liquid cooling loops to four.

In one example of an approach to these issues that is disclosed herein, a thermal control apparatus comprises a thermal control plate, a heat transfer plate, and a plurality of heat transfer devices. The thermal control plate is fabricated of an anisotropically thermally conductive plastic having a higher thermal conductivity in a plastic flow direction than in a cross-plastic flow direction. The thermal control plate includes a plurality of ribs on at least one side thereof, and at least partially defining an internal conduit through which a temperature controlled liquid flows when in operation. The heat transfer plate is thermally coupled with at least a portion of the thermal control plate. The heat transfer devices are thermally coupled to the thermal control plate through the heat transfer plate.

In another example, a compute device includes a printed circuit board, at least three compute subassemblies disposed on the printed circuit board, and a liquid loop. Each of the three compute subassemblies includes a thermal control plate defining a respective internal conduit therethrough. The liquid loop runs through each of the at least three compute subassemblies in series to control their temperature during operation. The liquid loop includes each of the internal conduits in each of the thermal control plates in each of the compute subassemblies.

In yet another example, a method for controlling the temperature of an electronic component includes providing a compute device with cooling. The compute device includes a printed circuit board, at least three compute subassemblies, and a liquid loop. Each of the three compute subassemblies includes a thermal control plate defining a respective internal conduit therethrough. The liquid loop extends through each of the at least three compute subassemblies such that each of the at least three compute subassemblies is temperature controlled in series during operation. The liquid loop includes each of the internal conduits in each of the thermal control plates in each of the compute subassemblies. The method then further includes circulating a temperature controlled liquid through the liquid loop to control the temperature of the at least three compute subassemblies through each of the at least three compute subassemblies in series.

Figure 1B:
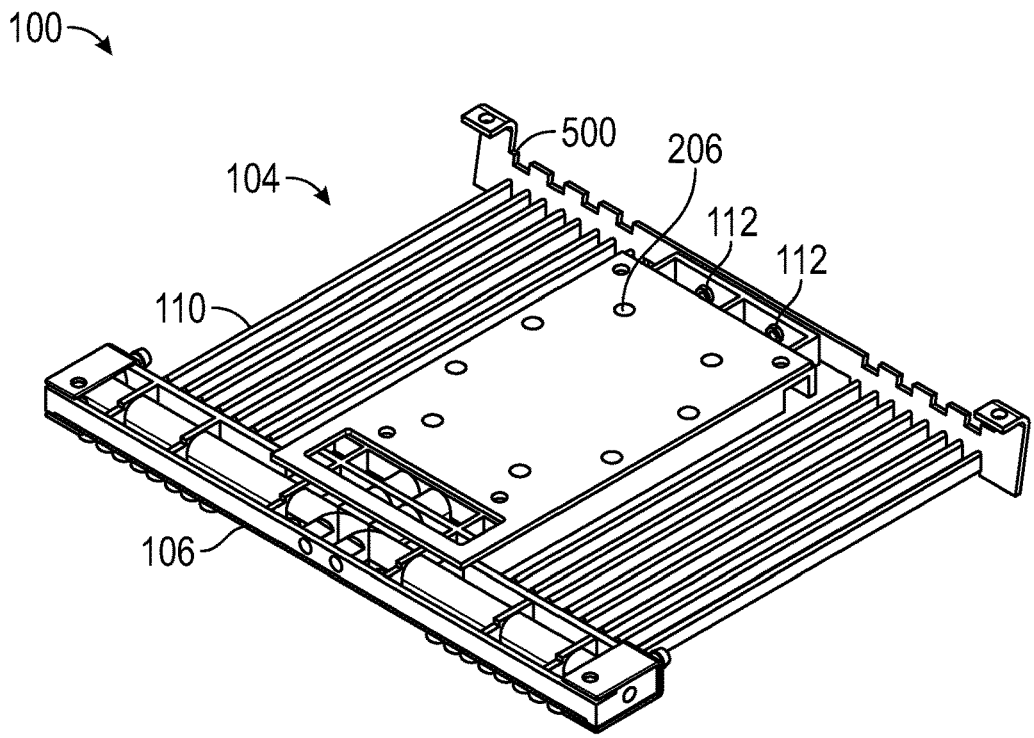
Figure 1C:
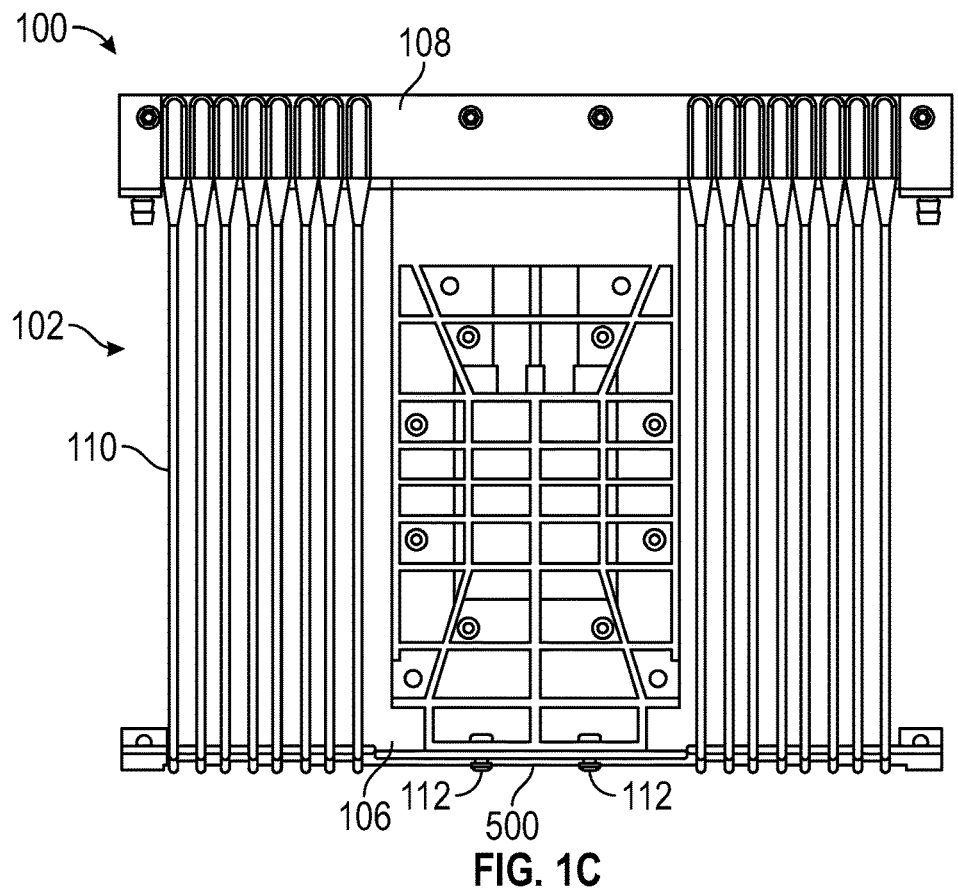
Figure 1D:
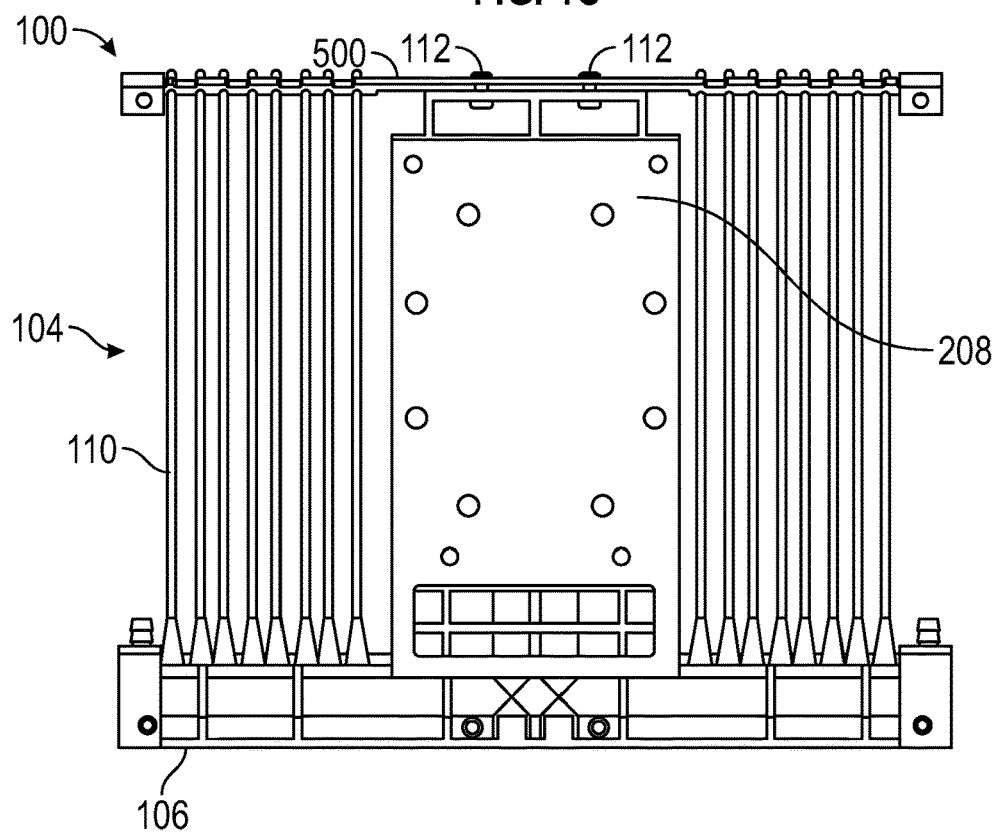

Turning now to the drawings, FIG. 1A-FIG. 1D are assembled, perspective views of a thermal control apparatus 100 in accordance with one or more examples. More particularly, FIG. 1A-FIG. 1B are assembled, perspective views of a first side 102 and a second side 104, respectively, of the thermal control apparatus 100. The first side 102 is the "top side" and the second side 104 is the "bottom side" of the thermal control apparatus 100 when the thermal apparatus 100 is installed in its typical or usual orientation relative to gravity in a computing apparatus as will be discussed further below. FIG. 1C-FIG. 1D are assembled, plan views of the first side 102 and the second side 104, respectively, of the thermal control apparatus 100.

Figure 2A:
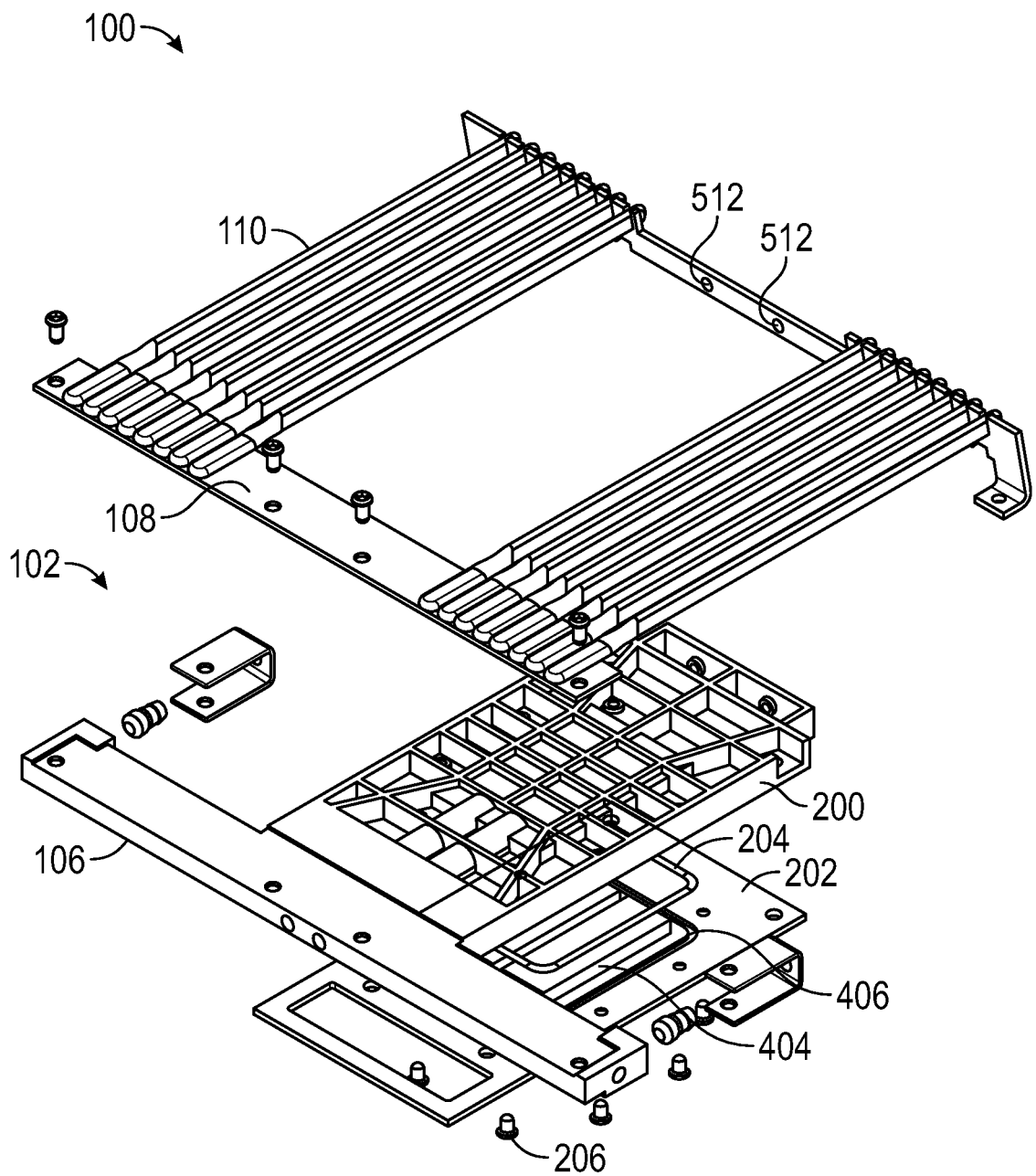
FIG. 2A-FIG. 2C are exploded views of the thermal control apparatus of FIG. 1A-FIG. 1C.
Figure 2B:
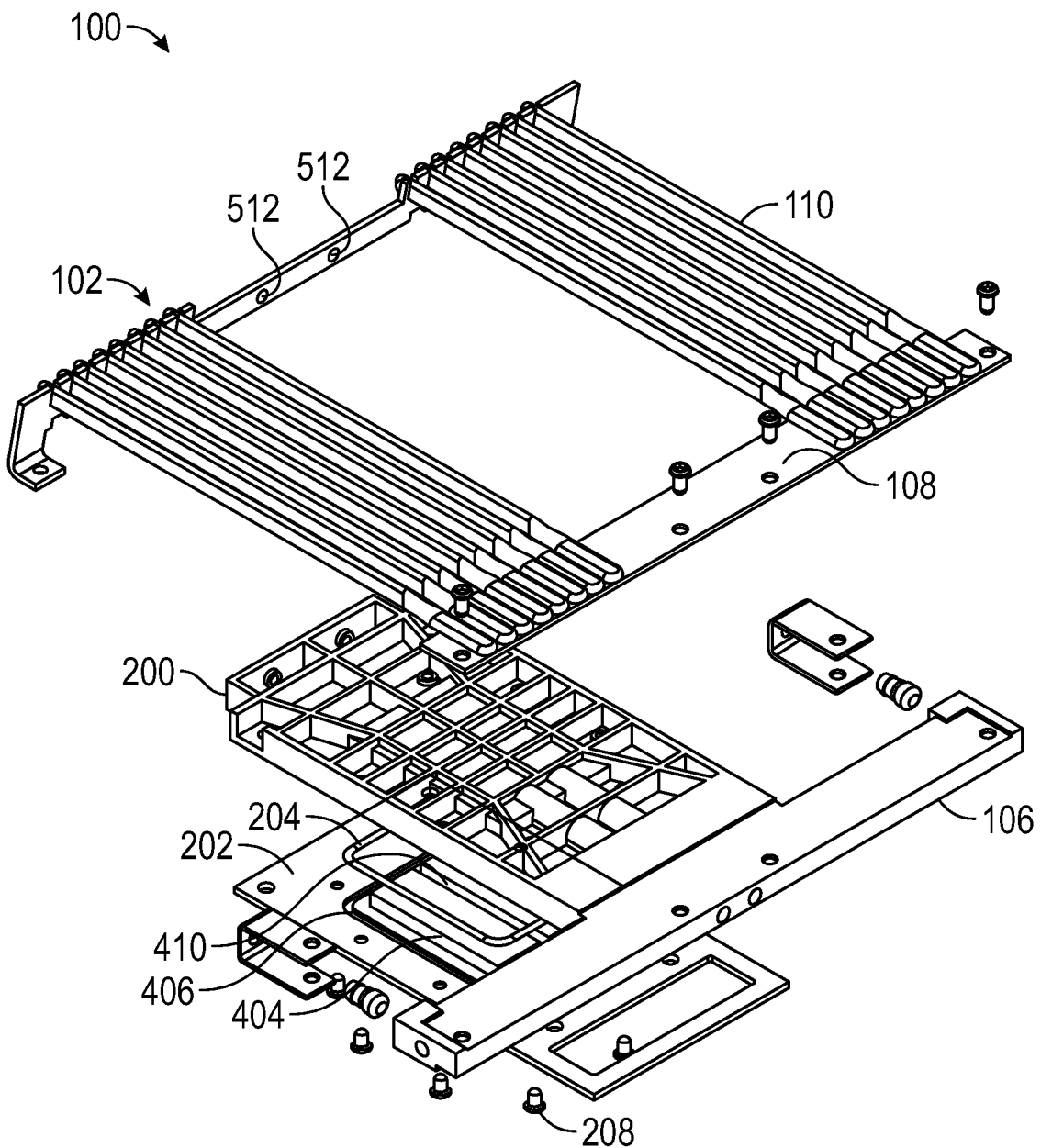
Figure 2C:
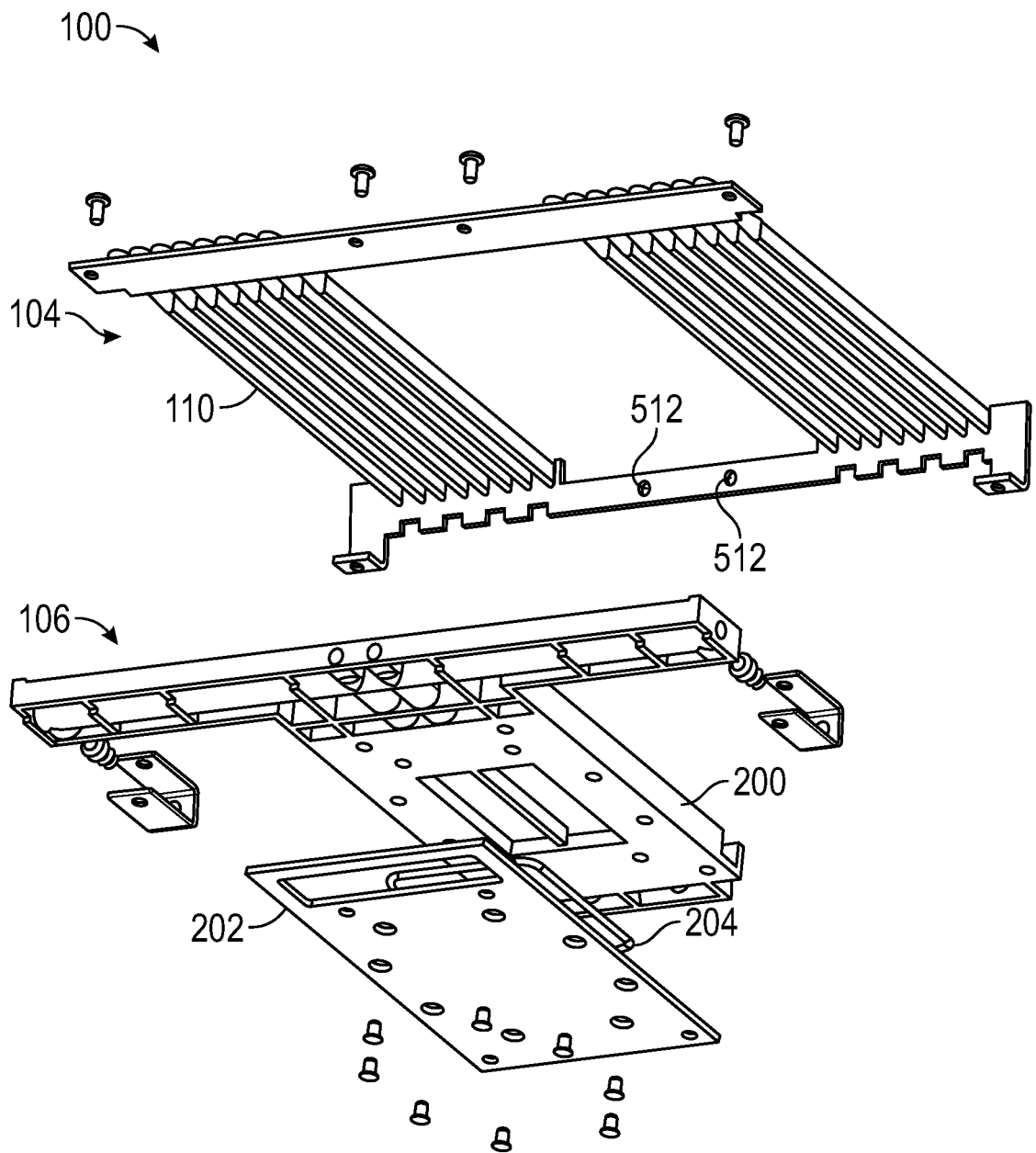

FIG. 2A-FIG. 2C are exploded views of the thermal control apparatus 100 of FIG. 1A-FIG. 1C. FIG. 2A-FIG. 2B are exploded, perspective views of the first side 102 from two different perspectives. FIG. 2C is an exploded, perspective view of the second side 104 of the thermal control apparatus 100.

Referring now to FIG. 1A-FIG. 1D and FIG. 2A-FIG. 2C, the thermal control apparatus 100 includes, in this example, a thermal control plate 106, a heat transfer plate 108, and a plurality of heat transfer devices 110 (only one indicated). The heat transfer plate 108 is thermally coupled with at least a portion of the thermal control plate 106. The heat transfer devices 110 are thermally coupled to the heat transfer plate 108 and, through the heat transfer plate 108, to the thermal control plate 106.

As used herein, "thermally coupled", or to "thermally couple" two objects, means to provide a thermally conductive pathway between the objects that allows heat to be conducted between the objects. Two objects or entities may be considered to be thermally coupled if any of the following are true: (1) the two objects are in contact with one another (either direct contact, or contact via a thermal interface material, or "TIM"), (2) the objects are both thermally coupled to the same thermal transfer device or to a chain of thermally coupled thermal transfer devices, or (3) a thermal conductivity between the two objects is 10 W/m-K or greater. Furthermore, as used herein, "thermal interface material" and "TIM" refer to a relatively thin, thermally conductive, and compliant (easily deformable) material placed between two devices at their thermal interface to improve the heat transfer by filling air gaps that would otherwise occur between the devices due to surface roughness and/or misalignment. Common examples include thermal gap pads, thermal grease, thermal paste, etc.

As best shown in FIG. 2A-FIG. 2C, the thermal control plate 106 includes a plate body 200, a thermal transfer plate 202, and a sealing element 204. The sealing element 204 seals the interface between the plate body 200 and the thermal transfer plate 202 to prevent liquid leakage. The sealing element 204 is, in this particular example, a gasket fabricated from an elastomeric material. However, other examples may use other sealing techniques to prevent liquid leakage. The sealing element 204 is placed between the thermal transfer plate 202 and the plate body 200 and the thermal transfer plate 202 is assembled to the plate body 200 using the fasteners 206 (only one indicated). Other examples may assemble the thermal transfer plate 202 to the plate body 200 using other techniques.

Figure 3A:
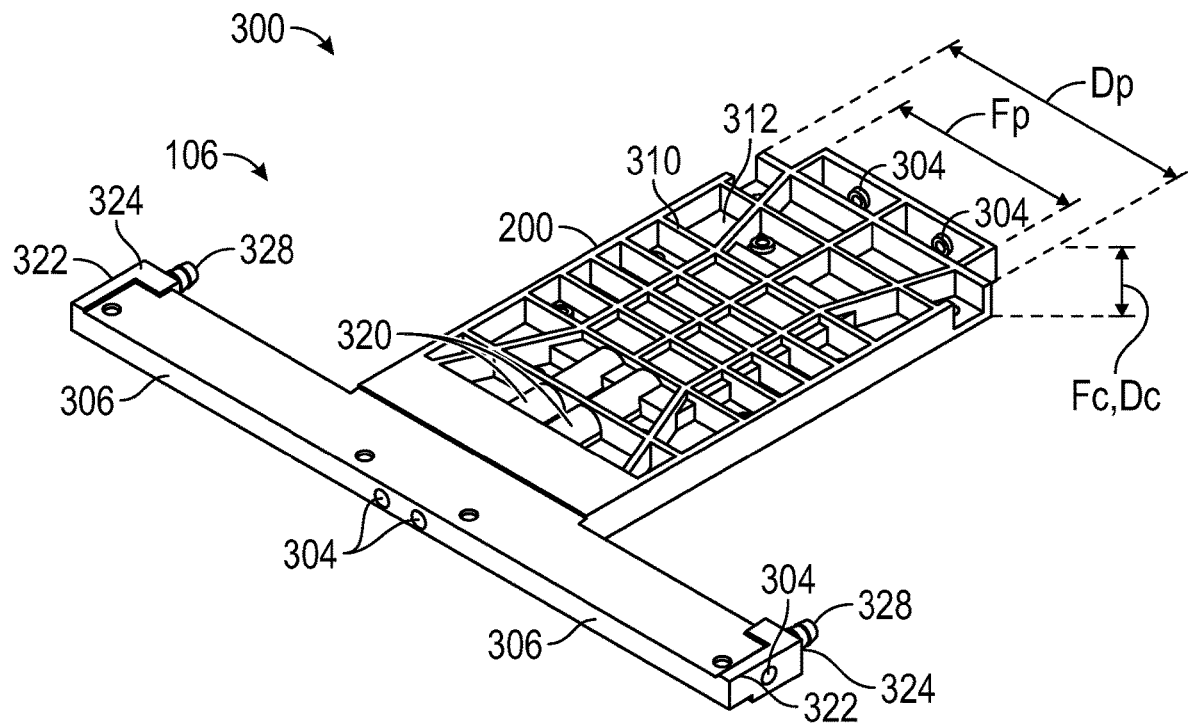
FIG. 3A-FIG. 3D illustrate a thermal control plate of the thermal control apparatus of FIG. 1A-FIG. 1D and FIG. 2A-FIG. 2C.
Figure 3B:
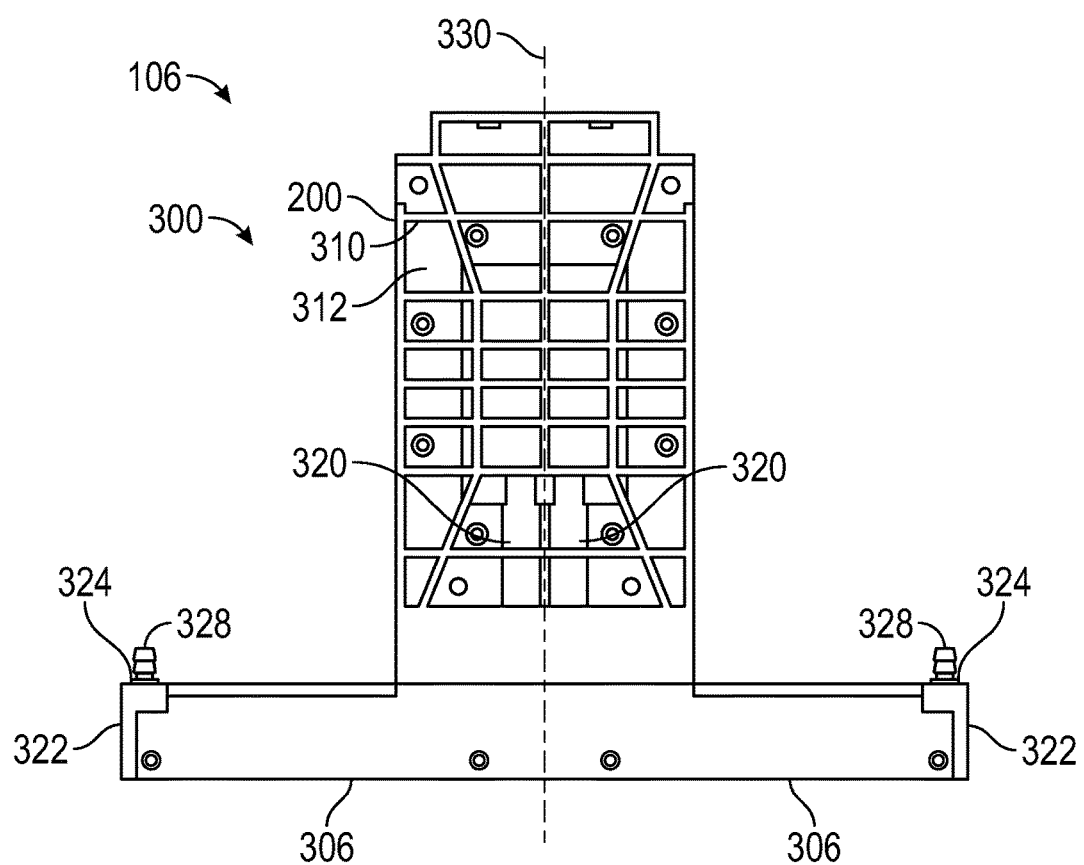
Figure 3C:
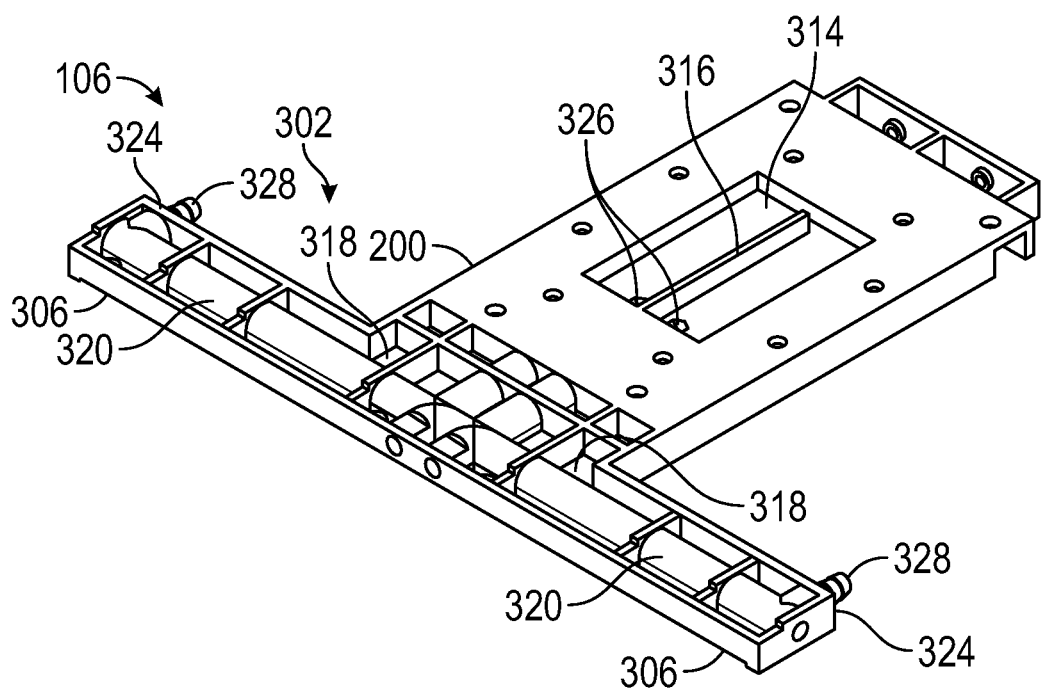
Figure 3D:
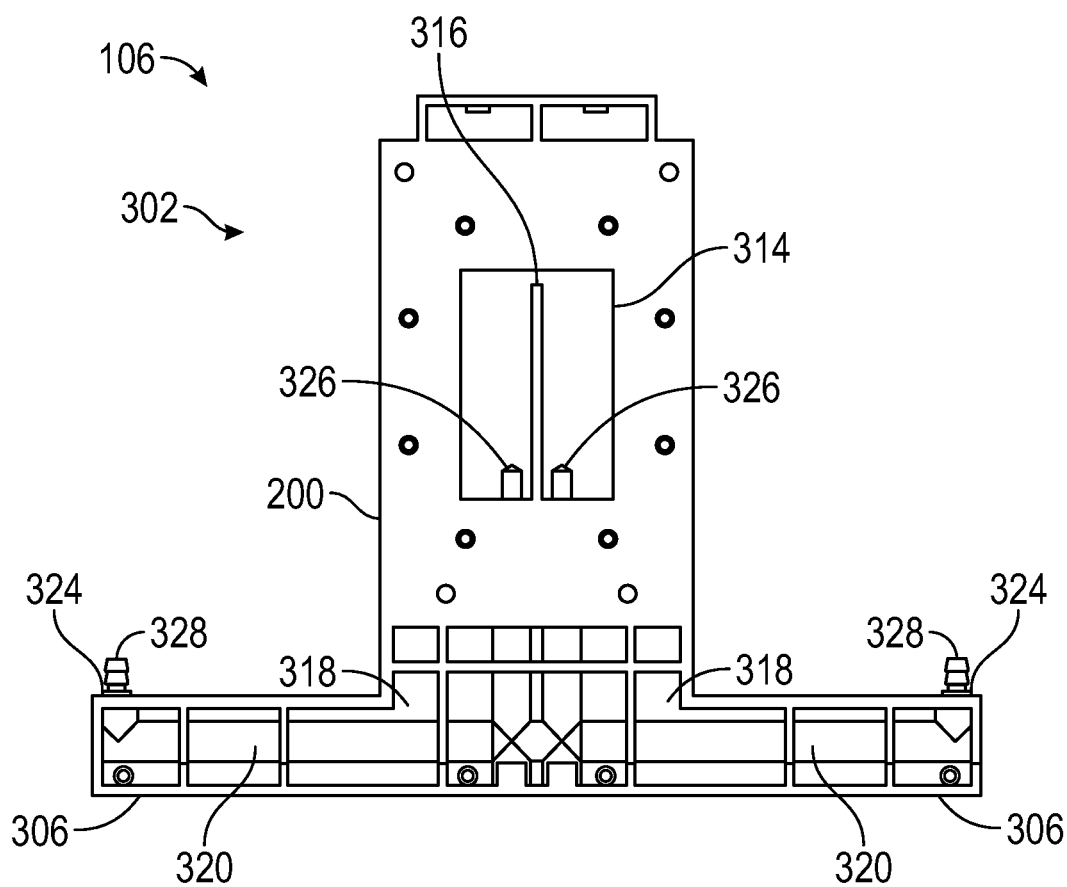

The thermal control plate 106 of the thermal control apparatus 100 first shown in FIG. 1A-FIG. 1D and FIG. 2A-FIG. 2C is better shown in FIG. 3A-FIG. 3D. FIG. 3A-FIG. 3B are a perspective view and a plan view, respectively, of the first side 300 of the thermal control plate 106. FIG. 3C-FIG. 3D are a perspective view and a plan view, respectively, of the second side 302 of the thermal control plate 106.

The thermal control plate 106 is fabricated from an anisotropically thermally conductive plastic. The anisotropically thermally conductive plastic may be selected from any one of several that are commercially available. Such anisotropically thermally conductive plastics may include polyphenylene sulfides, polyamides (such as PA6, PA12, PA66), liquid crystal polymers, and thermoplastic elastomers. Anisotropically thermally conductive plastics are commercially available from companies including, without limitation, Celanese Corporation, PolyOne Corp., Cool Polymers, LNP Engineering Plastics, RTP Co., Ensinger GmbH and Ticona Corp. For instance, some examples may use COOL-POLY® D-series Thermally Conductive Plastics available from Celanese Corporation. Other examples may use TECACOMP® TC compounds available from Ensinger GmbH.

Because the plastic from which it is fabricated is anisotropically thermally conductive, it transfers heat differently in different directions. The level of thermal conductivity is a function of the thermal conductivity for the material. It follows, then, that the anisotropically thermally conductive plastic from which the thermal control plate 106 is fabricated exhibits different thermal conductivities depending on the direction of heat transfer. The anisotropically thermally conductive plastic of the thermal control plate 106 has a higher thermal conductivity in a plastic flow direction $F_p$ than in a cross-plastic flow direction $F_c$.

More particularly, the thermal control plate 106 is fabricated using an injection molding technique. The anisotropically thermally conductive plastic is injected into a mold (not shown) through one or more injection ports (also not shown) in the mold during the manufacturing process. The plastic flow direction $F_p$ is the direction in which the anisotropically thermally conductive plastic flows into the mold upon injection. The cross-plastic flow direction $F_c$ is the direction transverse to the plastic flow direction $F_p$. Both the plastic flow direction $F_p$ and the cross-plastic flow direction $F_c$ are indicated in FIG. 3A. In one example, the thermal control plate 106 exhibits a thermal conductivity of ~23.02 W/m-K in the plastic flow direction $F_p$ and ~2.65 W/m-K in the cross-plastic flow direction $F_c$.

The thermal control plate 106 includes a plate body 200 and a pair of plate arms 306 formed integrally with the plate body 200 at a first end 308 of the plate body 200. The plate arms 306 extend from the plate body 200 in a cross-planar direction $D_c$, indicated in FIG. 3A. As used herein, "formed integrally" means that the plate arms 306 are fabricated with the plate body 200 such that the plate arms 306 are not assembled with the plate body 200 (e.g., not added after fabrication).

The plate body 200 includes a plurality of threaded holes 304 by which the plate body 200 may be fastened to various brackets (not shown) for mounting to a printed circuit board (also not shown) as described below. More particularly, in the illustrated example, the plate body 200 mounts to the central processing unit ("CPU") bolster plate (not shown), which is fixed to the printed circuit assembly ("PCA"). The holes 304 in the plate arms 306 are for mounting the assembly of FIG. 5A onto the plate body 200.

Note that, in this example, the cross-planar direction $D_c$ coincides with the cross-plastic flow direction $F_c$. Similarly, the thermal control plate 106 also exhibits a planar direction $D_p$, which happens to coincide with the plastic flow direction $F_p$ in this particular example. However, the two sets of directions are not the same in the sense that $F_c$, $F_p$ denote a functional aspect or inherent characteristic of the thermal control plate 106 while $D_c$, $D_p$ denote a structural aspect of the thermal control plate 106.

The plate body 200 includes a plurality of ribs 310 (only one indicated) on the first side 300, as shown in FIG. 3A-FIG. 3B. The ribs 310 help focus the heat transfer described below by preventing its dispersion through a greater volume. The spaces 312 between ribs also facilitate the injection molding process by helping prevent uncontrolled internal 'interstitial voids' that can form inside of the solid plastic material if the material is too thick. The plate body 200 also defines a first section 320 of an internal conduit. The first section 320 may be seen when viewing both the first side 300 and the second side 302.

Referring now to FIG. 3C-FIG. 3D, the plate body 200 also defines a cavity 314 on the second side 302 and a divider 316 in the cavity 134 whose function will be discussed below. Note that the second side 302 also includes a plurality of openings 318 (only two indicated) that reduce material costs in the fabricating process and reduce weight in the finished product. Also as best shown in FIG. 3C-FIG. 3D, each of the plate arms 306 define a part of the first section 320 of an internal conduit. The first section 320 includes distal fluid ports 324 that terminate exterior to the plate arms 306 and proximal fluid ports 326 that terminate in the cavity 314. As used herein, the terms "distal" and "proximal" are relative to the longitudinal centerline 330, shown in FIG. 3B, of the plate body 200. A fitting 328 is inserted into each of the distal fluid ports 324 to provide connection to an external conduit (not shown).

Returning now to FIG. 3A-FIG. 3B, each of the plate arms 306 defines a lip 322 at the end most distal from the plate body 200 into which the heat transfer plate 108 is inserted during assembly. The heat transfer plate 108, shown in FIG. 1A-FIG. 1D and FIG. 2A-FIG. 2C, is made of a thermally conductive material or a highly thermally conductive material. In the illustrated example, the heat transfer plate is made of a metal and, more particularly, copper. However, other material may be used. Such materials may include certain metals and plastics, for instance. Note that, when assembled, the heat transfer plate 108 is thermally coupled with at least a portion of the plate body 200 by direct contact between the two parts.

More particularly, an object, device, or assembly (which may comprise multiple distinct bodies that are thermally coupled, and may include multiple different materials), is "thermally conductive" between two thermal interfaces if any one of the following is true: (1) a thermal conductivity between the thermal interfaces is 10 W/m-K or greater at any temperature between 0° C. and 100° C., (2) the object is a continuous piece of a material that has a thermal conductivity (often denoted k, λ, or κ) between the two interfaces of 10 W/m-K or greater at any temperature between 0° C. and 100° C., (3) the object is a heat pipe, vapor chamber, continuous body of copper, or continuous body of aluminum. Examples of materials whose thermal conductivity is greater than 1 W·m−1·K−1 between 0° C. and 100° C. include almost all metals and their alloys (e.g., copper, aluminum, gold, etc.), some plastics (e.g., TECACOMP® TC compounds, COOLPOLY® D-series Thermally Conductive Plastics), and many other materials.

Still further, an object, device, or assembly (which may comprise multiple distinct bodies that are thermally coupled, and may include multiple different materials), is "highly thermally conductive" between two thermal interfaces if any one of the following is true: (1) a thermal conductivity between the thermal interfaces is 10 W/m-K or greater at any temperature between 0° C. and 100° C., (2) the object is a continuous piece of a material that has a thermal conductivity (often denoted k, λ, or κ) between the two interfaces of 10 W/m-K or greater at any temperature between 0° C. and 100° C., (3) the object is a heat pipe, vapor chamber, continuous body of copper, or continuous body of aluminum. Examples of materials whose thermal conductivity is 10 W/m-K or greater between 0° C. and 100° C. include certain types of copper, aluminum, silver, and gold.

Figure 4A:
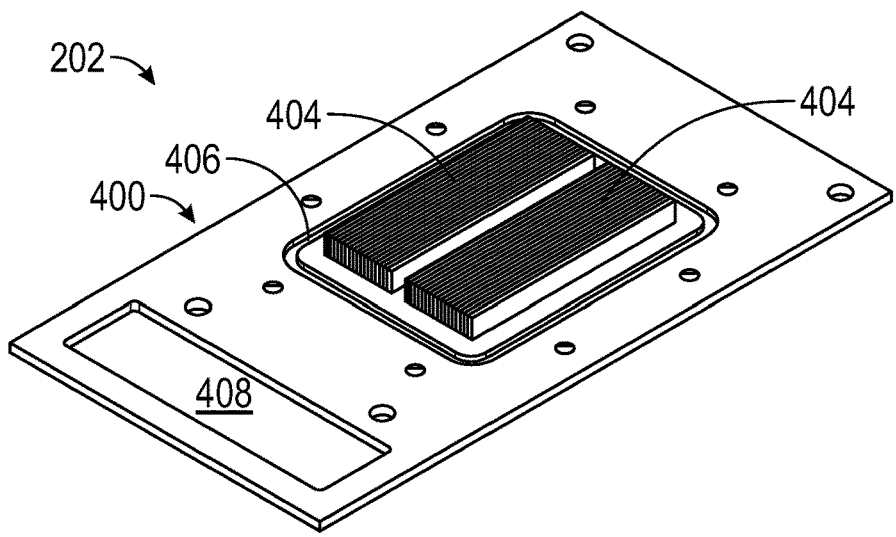
FIG. 4A-FIG. 4C are, respectively, a perspective view of the first side, a plan view of the first side, and a plan view of the second side of a thermal transfer plate of the thermal control plate of the thermal control apparatus of FIG. 1A-FIG. 1D and FIG. 2A-FIG. 2C.
Figure 4B:
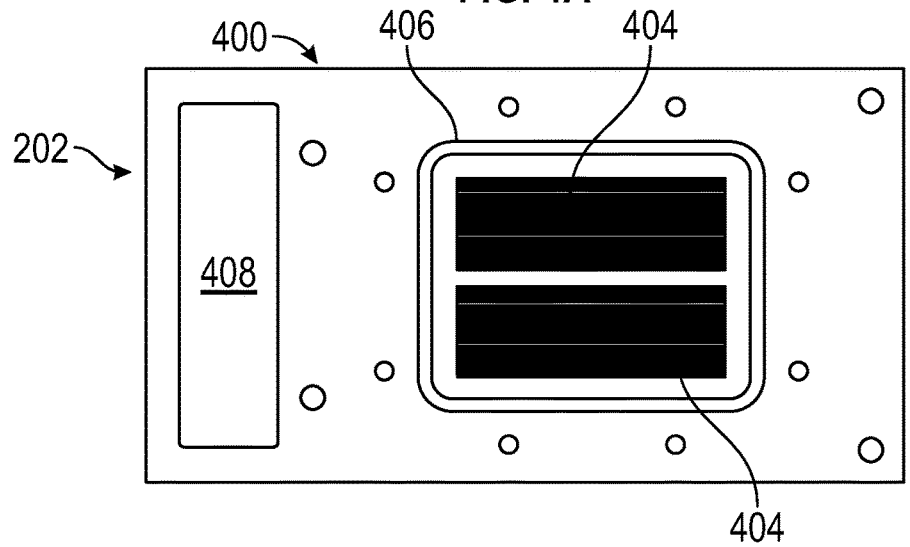
Figure 4C:
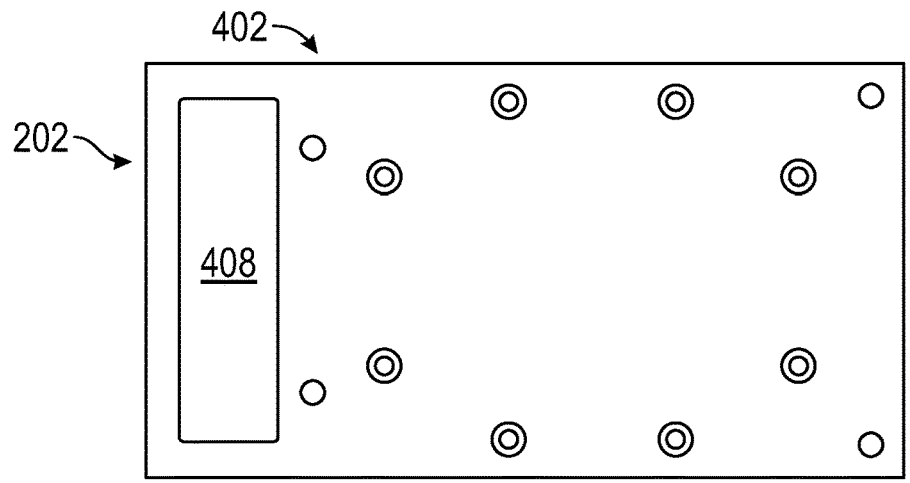

FIG. 4A-FIG. 4C illustrate the thermal transfer plate 202 of the thermal control apparatus 100 of FIG. 1A-FIG. 1D and FIG. 2A-FIG. 2C. FIG. 4A-FIG. 4C are a perspective view of a first side 400, a plan view of the first side 400, a plan view of the second side 402 of the thermal transfer plate 202. The thermal transfer plate 202 defines on the first side 400 thereof a plurality of microchannels 404 separated into, in this example, two sets. Note that, although the illustrated example employs the microchannels 404, other examples (not shown) may use, for instance, fins, channels, surface roughness, or any other surface extension to increase heat transfer. Each of these types of surface extension may also help to direct liquid flow through the cavity with the exception of the surface roughness.

The first side 400 defines a groove 406 around the microchannels 404 into which the sealing element 204 (shown in FIG. 2A-FIG. 2C) is placed during assembly. As will be described further below, when the first side 400 of the thermal transfer plate 202 is mated to the second side 402 of the plate body 200 over the cavity 314, the thermal transfer plate 202 and the plate body 200 define a second section of the internal conduit in the cavity 314.

The thermal transfer plate 202 may be fabricated from the same anisotropically thermally conductive plastic as is the plate body 200. In examples such as this one, it is desirable that the plastic be anisotropically thermally conductive in the same manner as is the anisotropically thermally conductive plastic of the plate body 200. Thus, the anisotropically thermally conductive plastic of the thermal transfer plate 202 has a higher thermal conductivity in a plastic flow direction $F_p$ than in a cross-plastic flow direction $F_c$, in the illustrated example. However, other examples may use other suitable materials, such as metals.

Note the clearance cutout 408 in the thermal transfer plate 202. The clearance cutout 408 is used to clear tall inductor components disposed on the printed circuit board (not shown) of the compute subassembly (not otherwise shown). In some examples, the thermal control plate 106 extends out and includes a thin strip of material (e.g., a gap pad that is not shown) to enhance cooling/heating of the power voltage regulators ("VRs", not shown) for the processing resources of the compute subassembly.

Figure 5A:
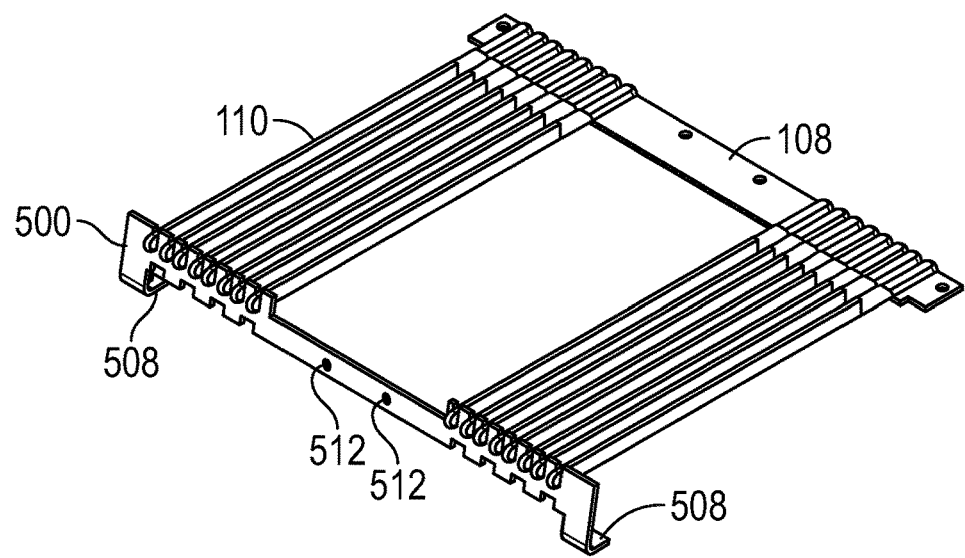
FIG. 5A-FIG. 5D illustrate a plurality of heat transfer devices supported by a bracket and thermally coupled to a heat transfer plate as first shown in the thermal control apparatus of FIG. 1A-FIG. 1D and FIG. 2A-FIG. 2C.
Figure 5B:
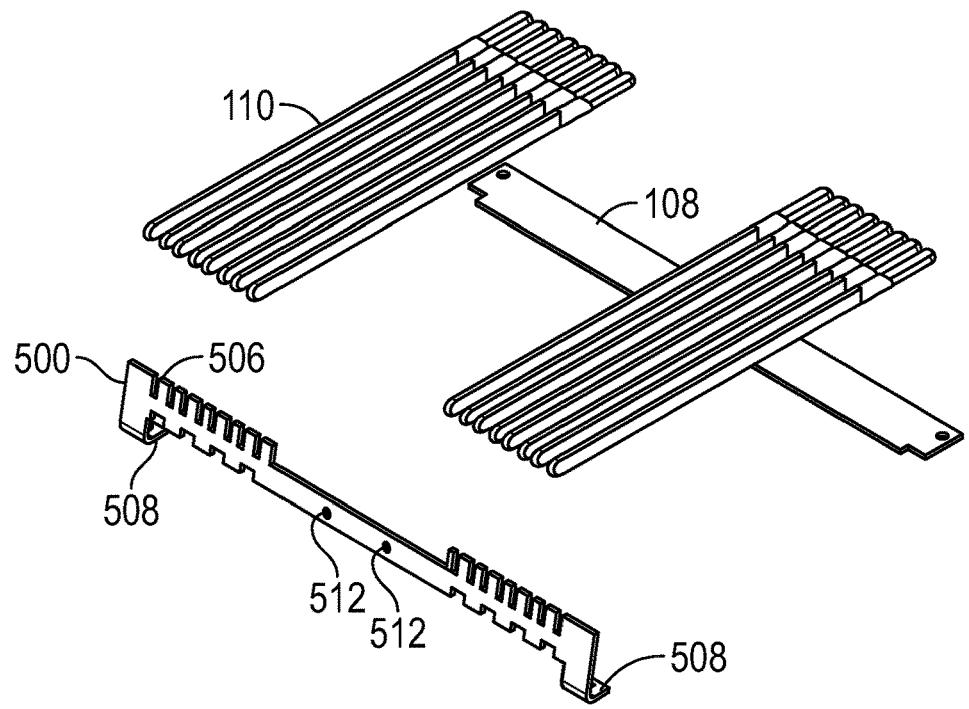
Figure 5C:
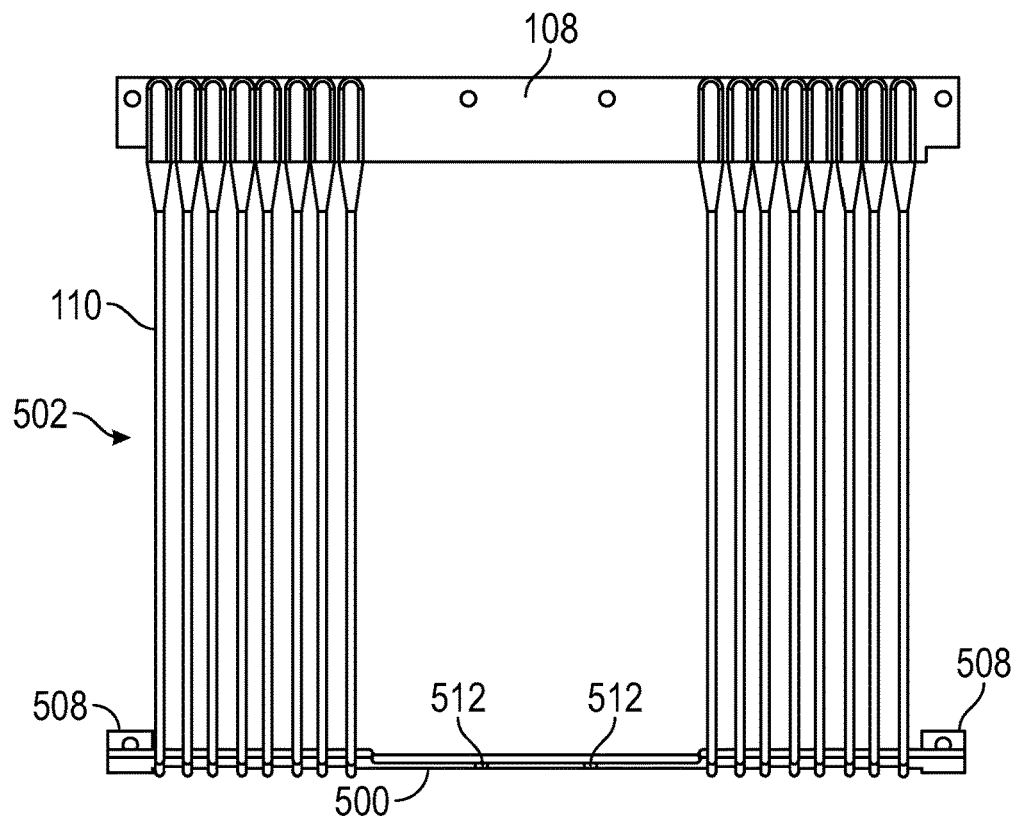
Figure 5D:
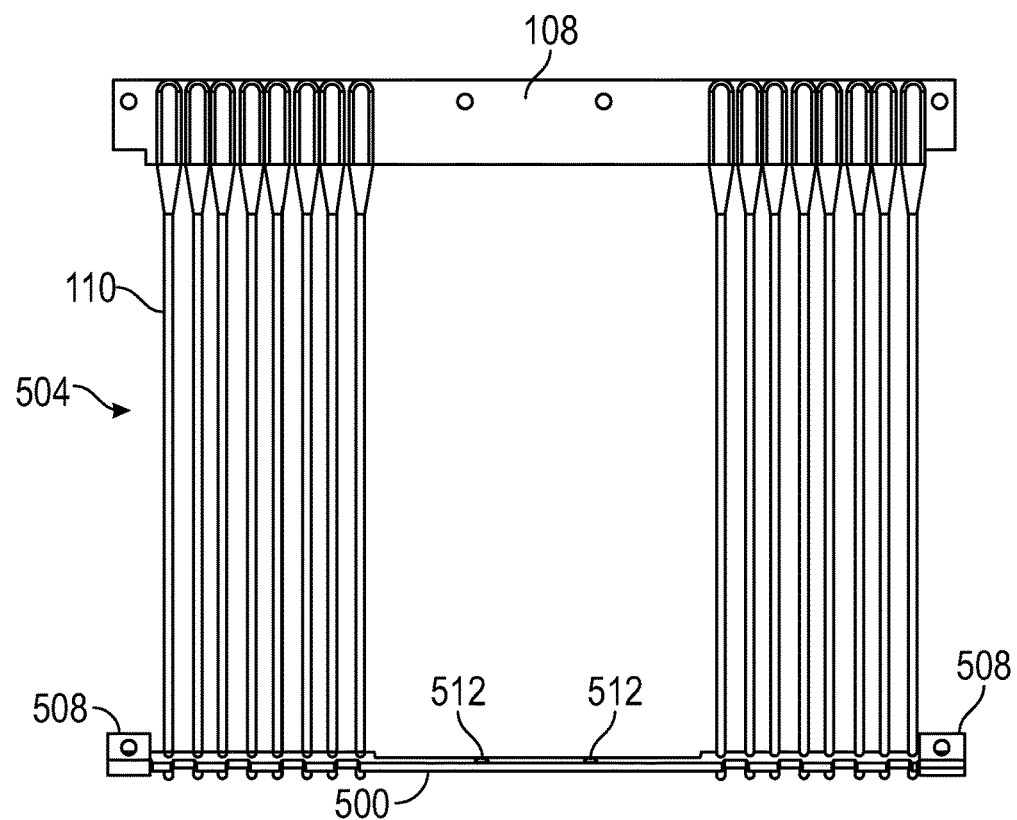

FIG. 5A-FIG. 5D illustrate a portion of the thermal control apparatus 100 first shown in FIG. 1A-FIG. 1D and FIG. 2A-FIG. 2O. More particularly, FIG. 5A-FIG. 5D depict a plurality of heat transfer devices 110 supported by a bracket 500 and thermally coupled to the heat transfer plate 108. FIG. 5A-FIG. 5B are an assembled and an exploded view of the first side 502 of the heat transfer devices 110, the bracket 500, and heat transfer plate 108. FIG. 5C-FIG. 5D are assembled, plan views of the first side 502 and a second side 504, respectively, of the heat transfer devices 110, the bracket 500, and heat transfer plate 108.

A "heat transfer device" may be any device that is thermally conductive and that is configured to receive heat from one heat source via conduction (contact) and transfer the heat into a heat sink via conduction (contact). Examples include heat pipes, vapor chambers, heat spreaders, a solid bar or strip of metal, etc. In the illustrated example, the heat transfer devices 110 are heat pipes, the details of which are not shown. A heat pipe is a specific type of thermal transfer device that includes a case (vessel) having walls that surround a sealed interior channel containing a working liquid and a wick such that the liquid transfers heat between different regions of the device by a cycle of vaporization and condensation. However, although the heat transfer devices 110 are heat pipes in these examples, other examples may use other kinds of heat transfer devices.

As best shown in FIG. 5B, the bracket 500 defines a plurality of notches 506 (only one indicated) into which one end of the heat transfer devices 110 are fitted so that the bracket 500 supports that end of the heat transfer device 110. The other end of the heat transfer devices 110 are supported by the heat transfer plate 108 when the heat transfer plate 108 is assembled to the plate body 200 as shown in FIG. 1A and FIG. 1C. The heat transfer devices 110 mechanically engage the heat transfer plate 108 in any one or more suitable ways. For example, the mechanical engagement may be implemented by, for instance and without limitation, soldering, press fitting, thermal epoxying, etc.

The heat transfer devices 110 are thermally coupled to the heat transfer plate 108 by virtue of their physical contact. As noted above, the heat transfer plate 108 is thermally coupled to the plate body 200 by virtue of their direct physical contact. Thus, the heat transfer devices 110 are thermally coupled to the plate body 302 through the heat transfer plate 108. The bracket 500 also includes a foot 508 on either end by which the bracket 500 may be affixed to a printed circuit board (not shown).

Referring now again to FIG. 1A-FIG. 1D and FIG. 2A-FIG. 2C collectively, in assembly, one example of how to assemble the heat control apparatus 100 will now be presented. Note that this is but one method of assembly and that other methods of assembly may be practiced. In particular, assembly does not necessarily have to be performed in the order discussed below. Other examples of the thermal control apparatus 100 may have more, or fewer, or different parts. Thus, the method of assembly presented below may be altered to accommodate these different examples of the thermal control apparatus 100.

The sealing element 204 is placed in the groove 406 of the thermal transfer plate 202. The microchannels 404 are aligned with the cavity 314, best shown in FIG. 3C-FIG. 3D, of the plate body 200. As a part of this alignment, the divider 316, also best shown in FIG. 3C-FIG. 3D, is aligned with the space 410 between the two sets of microchannels 404. Note that the divider 316 (also shown in FIG. 3C-FIG. 3D) does not extend the full length of the cavity 314 (only one indicated). The thermal transfer plate 202 is then affixed to the plate body 200 using the fasteners 206 (only one indicated) shown in FIG. 2A-FIG. 2C. As the thermal transfer plate 202 is affixed to the plate body 200, the pressure compresses the sealing element 204 to seal the second section (i.e., the cavity 314 and microchannels 404) of the internal conduit against liquid leakage.

The fasteners 206 permit the ready removal of the thermal transfer plate 202. This may be desirable, for instance, to clean the thermal transfer plate 202 if the microchannels become clogged. Note, however, that other examples may affix the thermal transfer plate 202 in other ways besides using fasteners. For instance, other examples may instead use other means for affixing, such as clamps (not shown).

The bracket 500 may then be secured to the thermal control plate 106 through the holes 512 using a plurality of fasteners 112 (shown in FIG. 1A-FIG. 1B). Once the bracket 500 is secured, the heat transfer devices 100 may be mounted to the bracket 500 as discussed above, being supported on one end by the bracket 500 and on the other end by the heat transfer plate 108. Alternatively, the heat transfer devices 110 may be mounted to the bracket 500 and soldered in place so that the bracket 500 and heat transfer devices 110 are secured as a single piece. The first side 102 of the assembled thermal control apparatus 100 is shown in FIG. 1A and the second side 104 of the assembled thermal control apparatus 100 is shown in FIG. 1B.

Accordingly, the thermal control apparatus 100 includes the thermal control plate 106, the heat transfer plate 108, and plurality of heat control devices 110. The thermal control plate 106 is fabricated of an anisotropically thermally conductive plastic having a higher thermal conductivity in a plastic flow direction $F_p$ than in a cross-plastic flow direction $F_c$. The thermal control plate 106 includes a plurality of ribs 310 on at least one side (e.g., the first side 300) thereof, and at least partially defining an internal conduit (e.g., the first section 320 and the second section) through which a temperature controlled liquid flows when in operation. The heat transfer plate 108 is thermally coupled with at least a portion of the thermal control plate 106. The plurality of heat transfer devices 110 are thermally coupled to the thermal control plate 106 through the heat transfer plate 108.

Figure 6A:
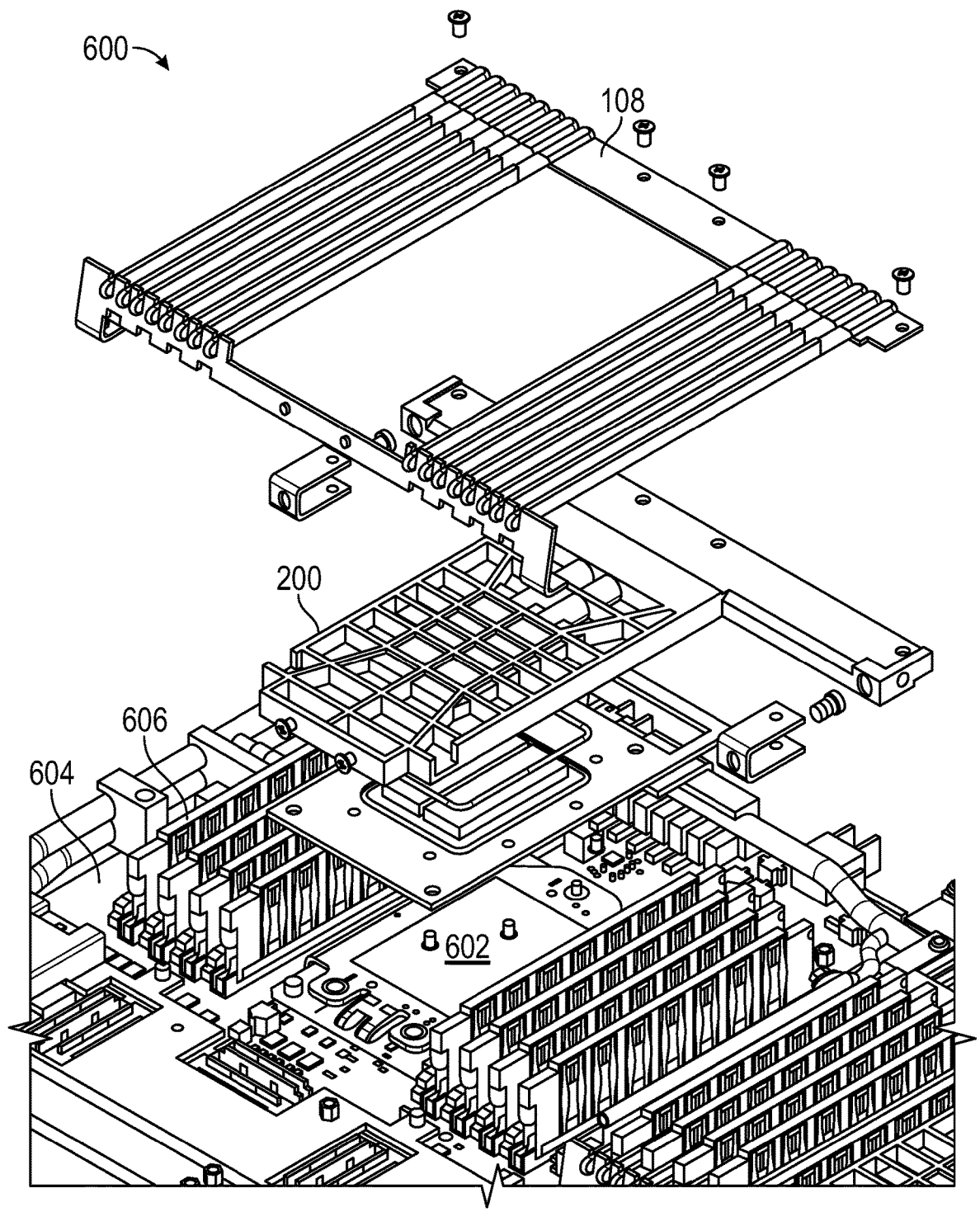
FIG. 6A-FIG. 6B are a fragmented, exploded view and an assembled view, respectively, of a compute subassembly including the thermal control apparatus of FIG. 1A-FIG. 1D and FIG. 2A-FIG. 2C.
Figure 6B:
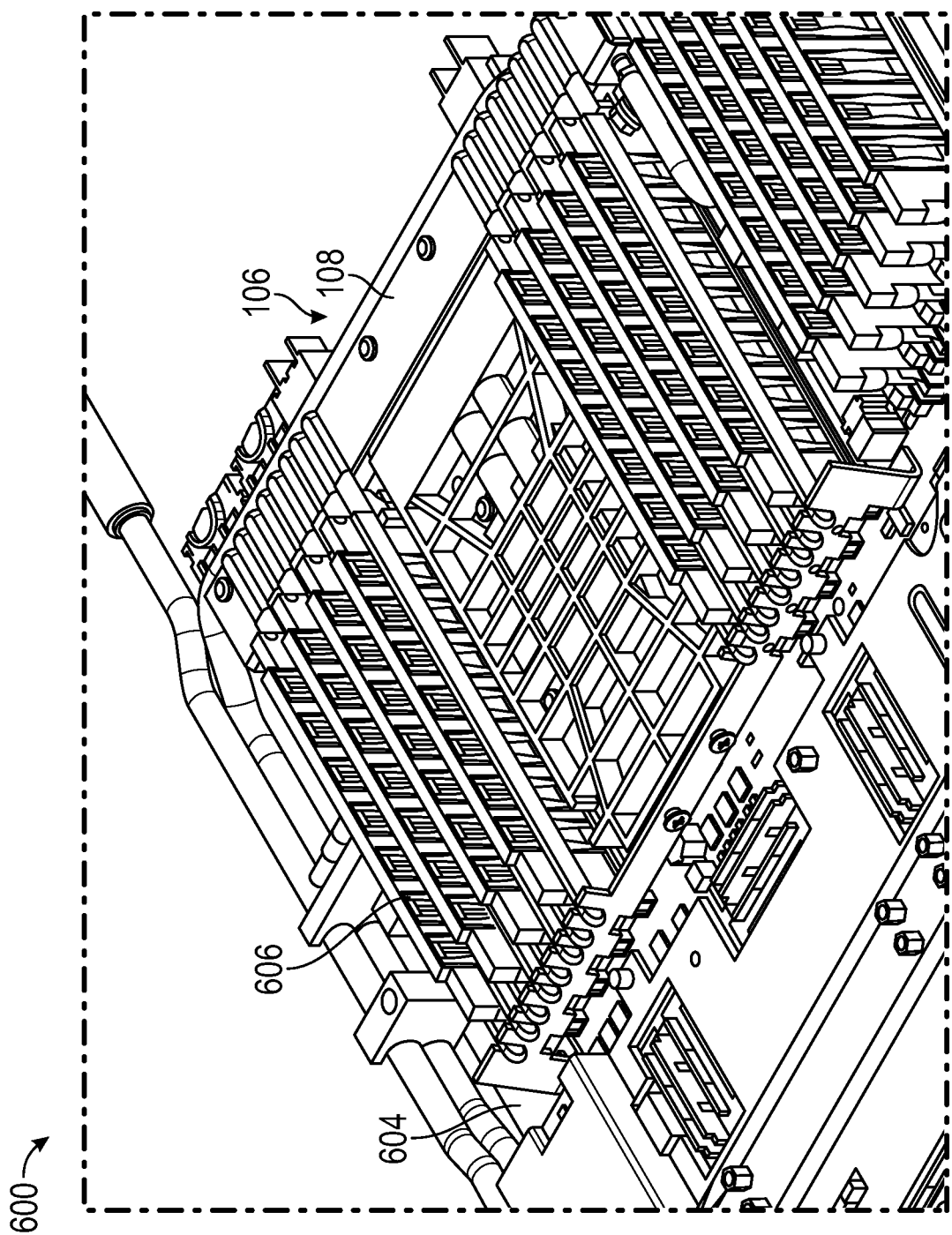

The thermal control apparatus 100 may be assembled into a compute subassembly in some examples such as the compute subassembly 600, shown in FIG. 6A-FIG. 6B. FIG. 6A-FIG. 6B are a fragmented, exploded view and a fragmented, assembled view, respectively, of a compute subassembly 600 including the thermal control apparatus 100 of FIG. 1A-FIG. 1D and FIG. 2A-FIG. 2C. Note that some examples of the compute subassembly 600 may use other, alternative examples of the thermal control apparatus 100.

The compute subassembly 600 is or comprises a portion of a computer: A computer is any electronic device that includes a processor and that is capable of executing programs comprising machine-readable instructions, including, for example, a server, a converged (or hyperconverged) appliance, a rack-scale system, some storage arrays, a personal computer, a laptop computer, a smartphone, a tablet, etc.

As best shown in FIG. 6A, the compute subassembly 600 includes a electronic component 602 mounted to a printed circuit board 604. The electronic component 602 is generally considered a heat generating electronic component because in operation it generates a high amount of heat relative to the other components of the compute subassembly 600. However, in some contexts the electronic component 602 may not be generating heat. For example, the electronic component 602 may not generate heat once operations cease and the compute subassembly 600 is turned off or deactivated. In some of these contexts, the electronic component 602 may actually need to be warmed before operations begin. Furthermore, in some contexts the electronic component 602, even though generating heat, may still need to be warmed. The thermal control apparatus 100 can therefore be used either to cool or heat elements of the compute subassembly 600 such as the electronic component 602.

The electronic component 602 in the illustrated example is a processing resource. A processing resource may be, for instance, and without limitation, a processor such as a controller, microprocessor, a central processing unit ("CPU"), a graphics processing unit ("GPU") an application specific integrated circuit ("ASIC"), or a processor chip set. The electronic component 602 in other examples may be, again without limitation, one or more memory modules, one or more converters, one or more voltage regulators, or some other electronic component(s) considered by the art to generate a relatively high amount of heat in operation.

The compute subassembly 600 includes additional heat generating electronic components in addition to the electronic component 602. The processing resource that is the electronic component 602 is, in this particular example, flanked on either side by a plurality of Dual In-Line Memory Modules ("DIMMs") 606 (only one indicated). The electronic component 602 is flanked by eight DIMMs 606, four on each side. The number of DIMMs 606 is implementation specific as is the entire composition of the compute subassembly 600. Note also that the thermal control apparatus 100 may be used to cool computing components that are not a part of a compute subassembly in other examples.

When the compute subassembly 600 is assembled as shown in FIG. 6B, the heat transfer devices 110 are in thermal contact with the DIMMs 606 and the heat transfer plate 108. The heat transfer plate 108 is in thermal contact with the thermal control plate 106 and the thermal control plate 106 is in thermal contact with the electronic component 602 (e.g., a processing resource). Thus, the DIMMs 606, heat transfer devices 110, heat transfer plate 108, thermal control plate 106, and electronic component 602 are all thermally coupled with one another.

Figure 7:
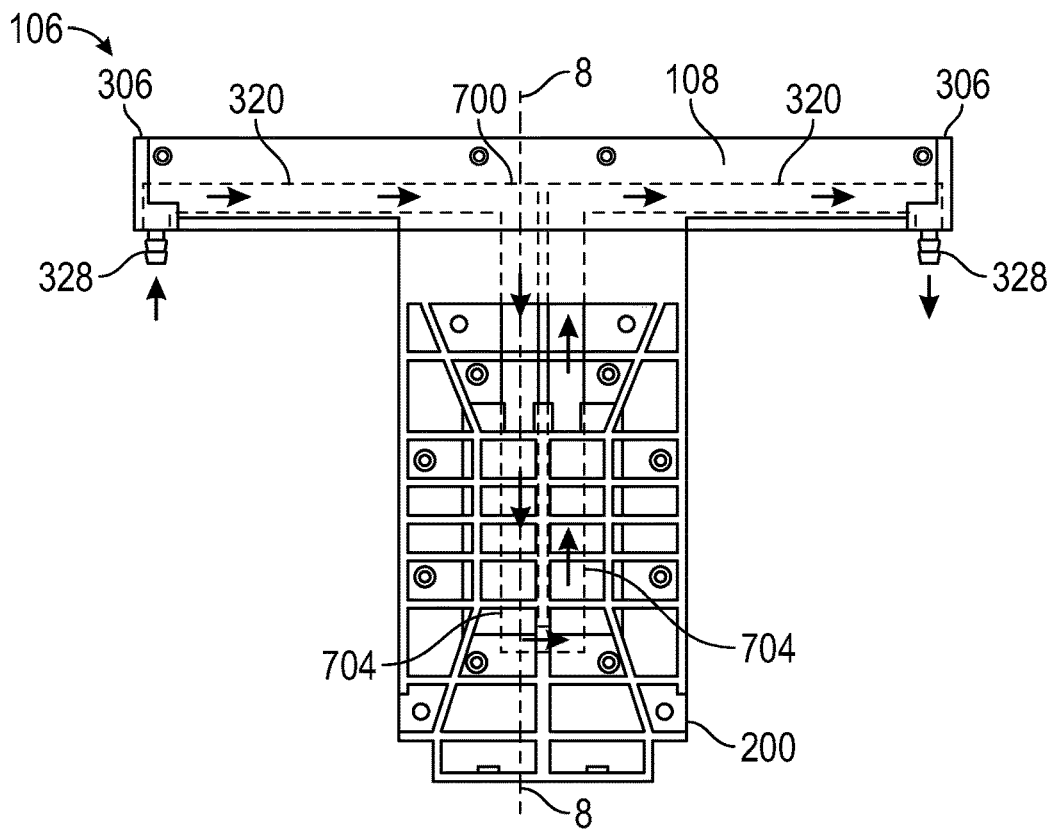
FIG. 7 illustrates fluid flow through the thermal control plate and the heat transfer plate of the thermal control apparatus of FIG. 1A-FIG. 1D and FIG. 2A-FIG. 2C.

The thermal control apparatus 100 is used to heat and cool the compute subassembly 600 as desired. FIG. 7 illustrates fluid flow through the thermal control plate 106 of the thermal control apparatus 100 of FIG. 1A-FIG. 1D and FIG. 2A-FIG. 2C. As discussed above, the thermal control plate 106 defines an internal conduit. An internal conduit 700 is shown in FIG. 7 in broken lines. The internal conduit 700 includes a first section 320 defined by the thermal control plate 106 and a second section 704. The second section 704 is defined by the microchannels 404 of the thermal transfer plate 202 and the divider 316 in the cavity 314 of the plate body 200 of the thermal control plate 106 as discussed above relative to FIG. 2A-FIG. 4C.

A temperature controlled liquid (not shown) is then circulated through the fittings 328 and into the internal conduit 700. The direction of flow for the temperature controlled liquid through the thermal control plate 106 and the internal conduit 700 is not material in the sense that the liquid may move either left to right or right to left in FIG. 7. However, the direction of flow may become material in the context of the design for the full compute device (not shown) depending on how the thermal control system is designed.

The temperature controlled liquid may be any suitable thermal transport liquid known to the art. In some examples, the temperature controlled liquid may be any one of several liquids used in temperature control—e.g., for cooling or heating. For example, some suitable liquids include water, propylene glycol and mixtures thereof, such as refrigerants, etc. In one example, the temperature controlled liquid is a 25% propylene glycol, 75% water mixture. However, other liquids may be used in other examples.

Figure 8A:
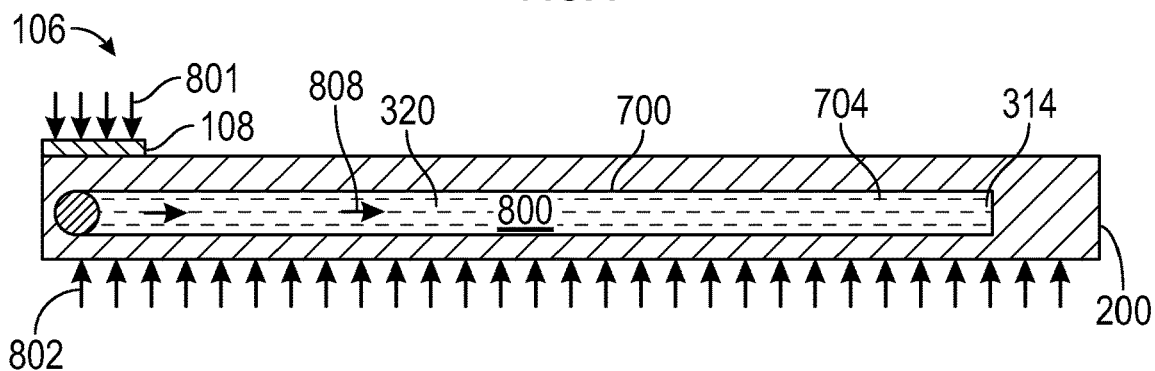
FIG. 8A-FIG. 8B conceptually illustrate heat transfer through the thermal control plate and the heat transfer plate of the thermal control apparatus of FIG. 1A-FIG. 1D and FIG. 2A-FIG. 2C for cooling and heating, respectively, in cross-sectional views along line 8-8 of FIG. 7.

FIG. 8A illustrates the thermal control plate 106 when used in a cooling context. In this context, the temperature controlled liquid 800 acts as a coolant. In some examples, the temperature controlled liquid 800 may be chilled but may not be in other examples. When used for cooling, the thermal control plate 106 functions as a liquid cooled thermal control plate. As used herein, the term "liquid cooled thermal control plate" refers to a device that receives heat from a solid body via conduction (contact) and dissipates that heat into liquid coolant that flows on or through the thermal control plate. The liquid coolant is either (a) in direct contact with the thermal control plate (e.g., flowing through an interior chamber of the cold plate) or (b) flowing through a pipe/tube that is in contact with the thermal control plate.

As discussed above, the DIMMs 606 are thermally coupled to the thermal control plate 106 through the heat transfer devices 110 (first shown in FIG. 1A) to the plate arms 306 and the heat transfer plate 108. The heat generated by the DIMMs 606 transfers into the thermal control plate 106 as indicated by the arrows 801 (only one indicated) through the thermal coupling just discussed. Heat generated by the electronic component 602 transfers directly into the thermal control plate 106 directly through the thermal contact between the thermal control plate 106 and the electronic component 602 as indicated by the arrows 802 (only one indicated).

The heat generated by the DIMMs 606 and the electronic component 602 then transfers into the temperature controlled liquid 800 circulating through the internal conduit 700 in the direction of the arrows 808 (only one indicated). The temperature controlled liquid 800 then carries the heat away from the DIMMs 606, electronic component 602, and the thermal control plate 106. Note that the design of the ribs 310 can facilitate the directionality of the heat transfer's flow to help concentrate the flow on top the internal conduit 700. The length of the internal conduit 700 through the thermal control plate 106 also helps facilitate heat transfer by presenting more areal thermal contact and increased time for the thermal contact.

Figure 8B:
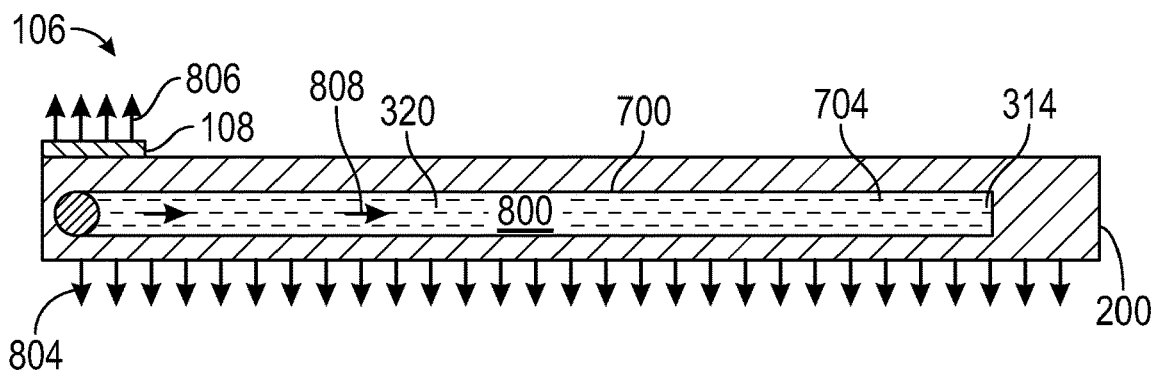

FIG. 8B illustrates the in the thermal control plate 106 when used in a heating context. The heat transfer occurs in largely the same manner except in the opposite direction. In some examples, the temperature controlled liquid 800 may be heated but may not be in other examples. When used for heating, the thermal control plate 106 functions as a liquid heated thermal control plate. As used herein, the term "liquid heated thermal control plate" refers to a device that transmits heat to a solid body via conduction (contact) from a temperature controlled liquid that flows on or through the thermal control plate. The temperature controlled liquid is either (a) in direct contact with the thermal control plate (e.g., flowing through an interior chamber of the thermal control plate) or (b) flowing through a pipe/tube that is in contact with the thermal control plate.

As the temperature controlled liquid 800 courses through the internal conduit 700, the heat transfers into the thermal control plate 106. From the thermal control plate 106, the heat transfers directly into the electronic component 602 as indicated by the arrows 804 (only one indicated). The heat also transfers into the DIMMs 606 as indicated by the arrows 806 (only one indicated) through the thermal coupling provided by the heat transfer plate 108 and the heat transfer devices 110.

Figure 9:
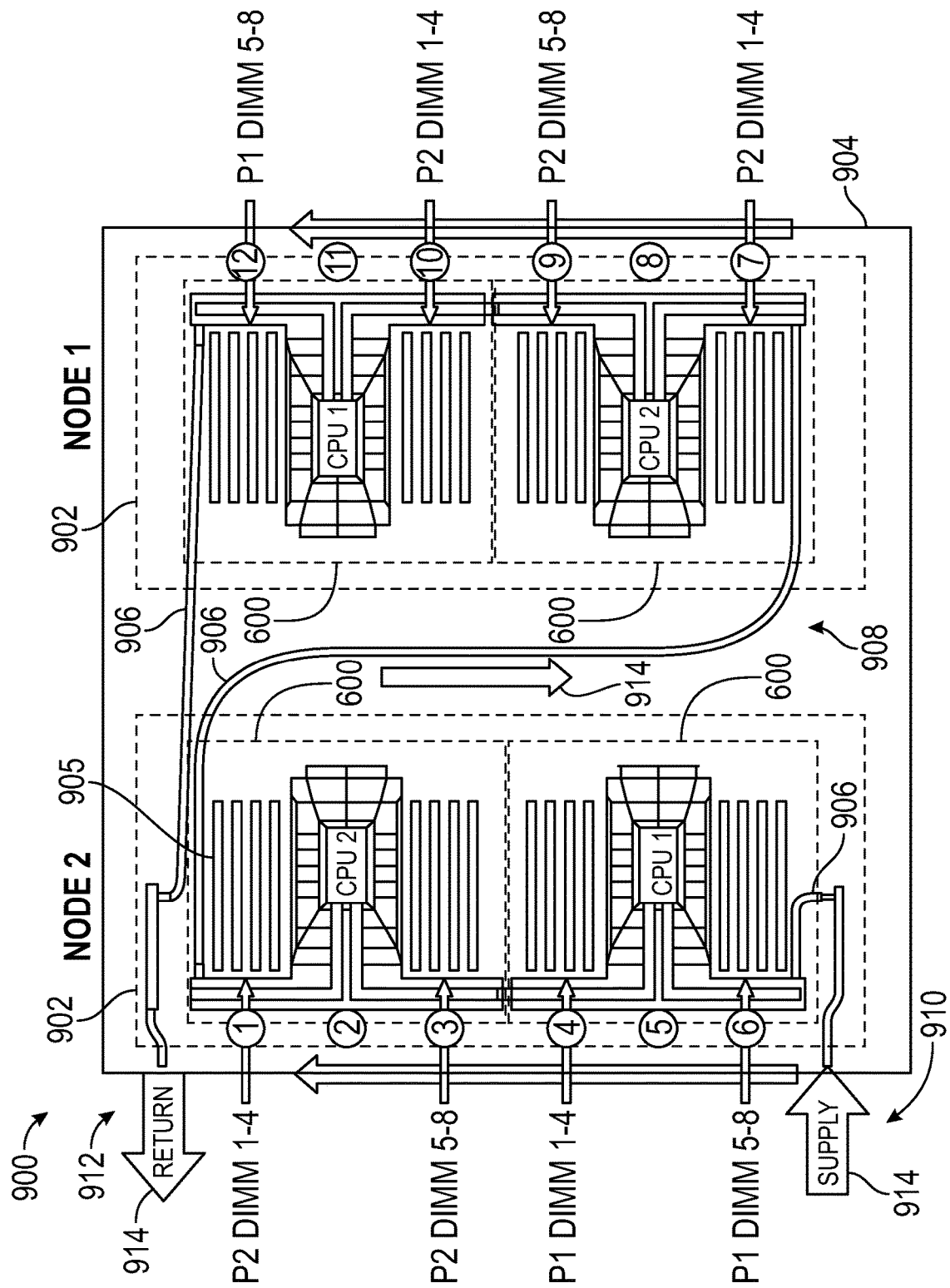
FIG. 9 conceptually illustrates fluid flow and heat transfer for cooling of a compute device including at least three compute subassemblies in series.

As noted above, the compute assembly 600 may form a portion of a larger compute device. FIG. 9 conceptually illustrates fluid flow and heat transfer for cooling of a compute device 900 including at least three compute subassemblies 600 in series. More particularly, the compute device 900 includes four compute subassemblies 600, each of which is cooled in series with the others.

The compute device 900 in this example is designed to be a rack mounted server and so is disposed in a tray (not shown). The compute device 900 comprises two compute nodes 902, each compute node 902 comprising two compute subassemblies 600. Although each pair of compute subassemblies 600 define a single compute node 902, all four compute subassemblies 600 are assembled to a single printed circuit board 904. As discussed above, each compute assembly 600 includes a thermal control plate 106 defining an internal conduit 700 as shown in FIG. 7. The compute assemblies 600 also include DIMMs 606 and heat transfer devices 110 as discussed above and shown in FIG. 1A-FIG. 1D. In FIG. 9, however, the DIMMs 606 and heat transfer devices 110 are shown as single graphical elements 905 (only one indicated).

Each of the internal conduits 700 is fluidly connected in series by external conduit 906. The external conduit 906 may be fabricated from copper, stainless steel, or a flexible polymer tube, such as Ethylene Propylene Diene Monomer ("EPDM") rubber, corrugated Fluorinated Ethylene Propylene ("FEP") or Polytetrafluoroethylene ("PTFE"), etc. The external conduit 906 and internal conduits 700 define a liquid loop 908. The external conduit 906 is fluidly connected to the internal conduits 700 using fittings 328 best shown in FIG. 3A-FIG. 3D. The temperature controlled liquid (not shown) and the motive force for the flow of the temperature controlled liquid are supplied from the thermal control system (not otherwise shown) for the rack (also not shown) through the supply 910. Once the temperature controlled liquid has circulated through the liquid loop 908, the temperature controlled liquid is returned to the thermal control system for the rack through the return 912. Again, the direction of flow for the temperature controlled liquid is not material and, in some examples, the supply 910 and return 912 may be functionally interchanged. In the illustrated examples, fluid flow is indicated by the arrow 914 and proceeds through the points 1-12 in order.

The temperature controlled liquid enters the liquid loop 908 through the supply 910 and circulates through each of the compute subassemblies 600 in series as indicated by the arrows 914. The circulation includes circulating through each of the internal conduits 700 in series, or one after another. If the thermal control system is in a warming operational mode, the temperature controlled liquid cools and, if the thermal control system in a cooling mode, the temperature controlled liquid warms as it circulates and as heat is transferred in or out of the compute subassemblies 600. Although the temperature controlled liquid heats or cools, the initial temperature and flow rate can be selected to achieve the desired thermal control.

Thus, in at least some examples, a compute device 900 comprises a printed circuit board 904 on which at least three compute subassemblies 600 are disposed. Each of the compute subassemblies 600 includes a thermal control plate 106 defining a respective internal conduit 700 therethrough. The compute device 900 includes a liquid loop 908 through which each of the at least three compute subassemblies 600 is temperature controlled in series during operation. The liquid loop 908 includes each of the internal conduits 700 in each of thermal control plates 106 in each of the compute subassemblies 600.

Figure 10A:
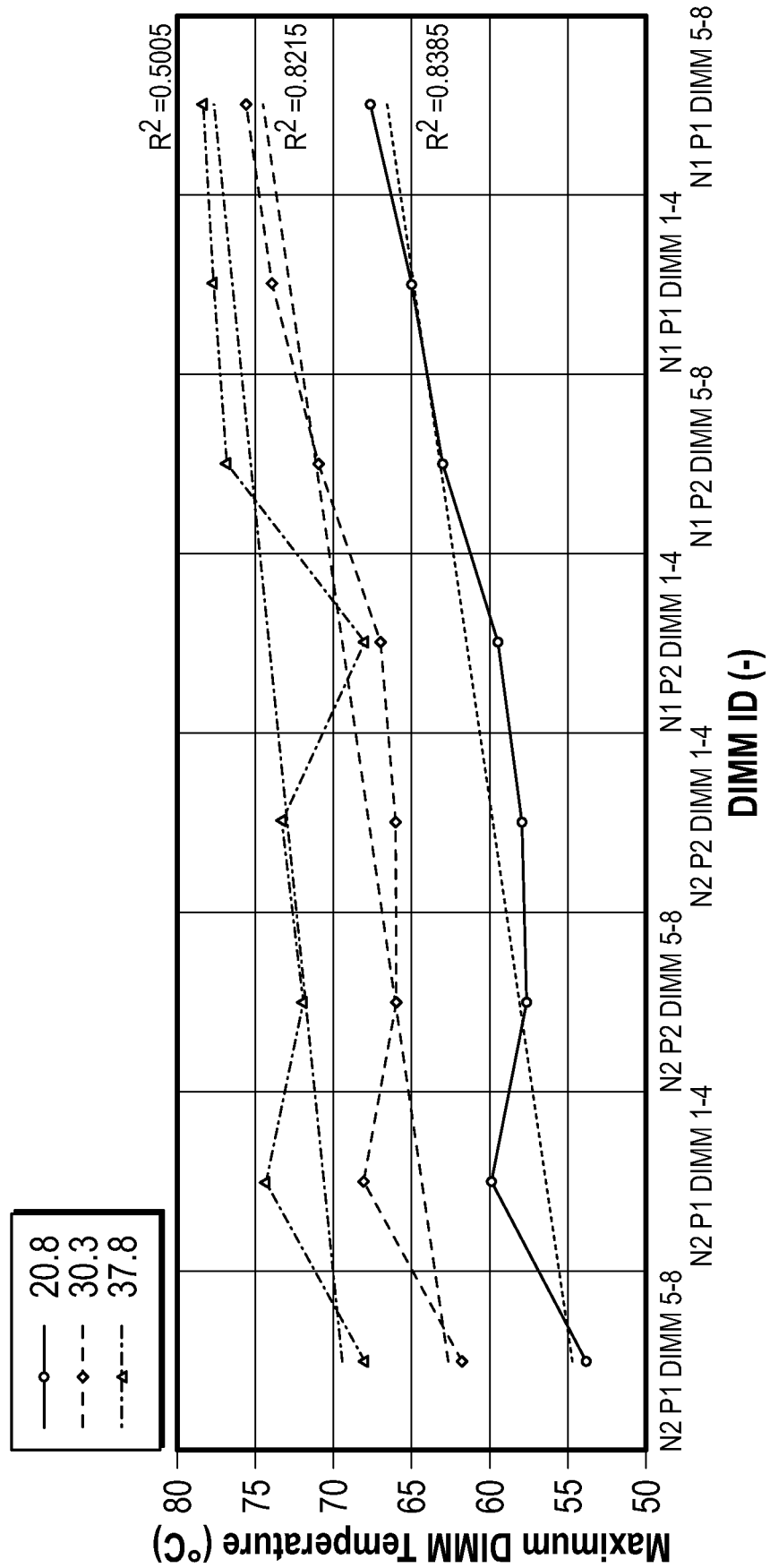
FIG. 10A-FIG. 10B present measured temperatures at various points in the liquid loop of an actual test implementation of a compute device such as the compute device shown in FIG. 9.
Figure 10B:
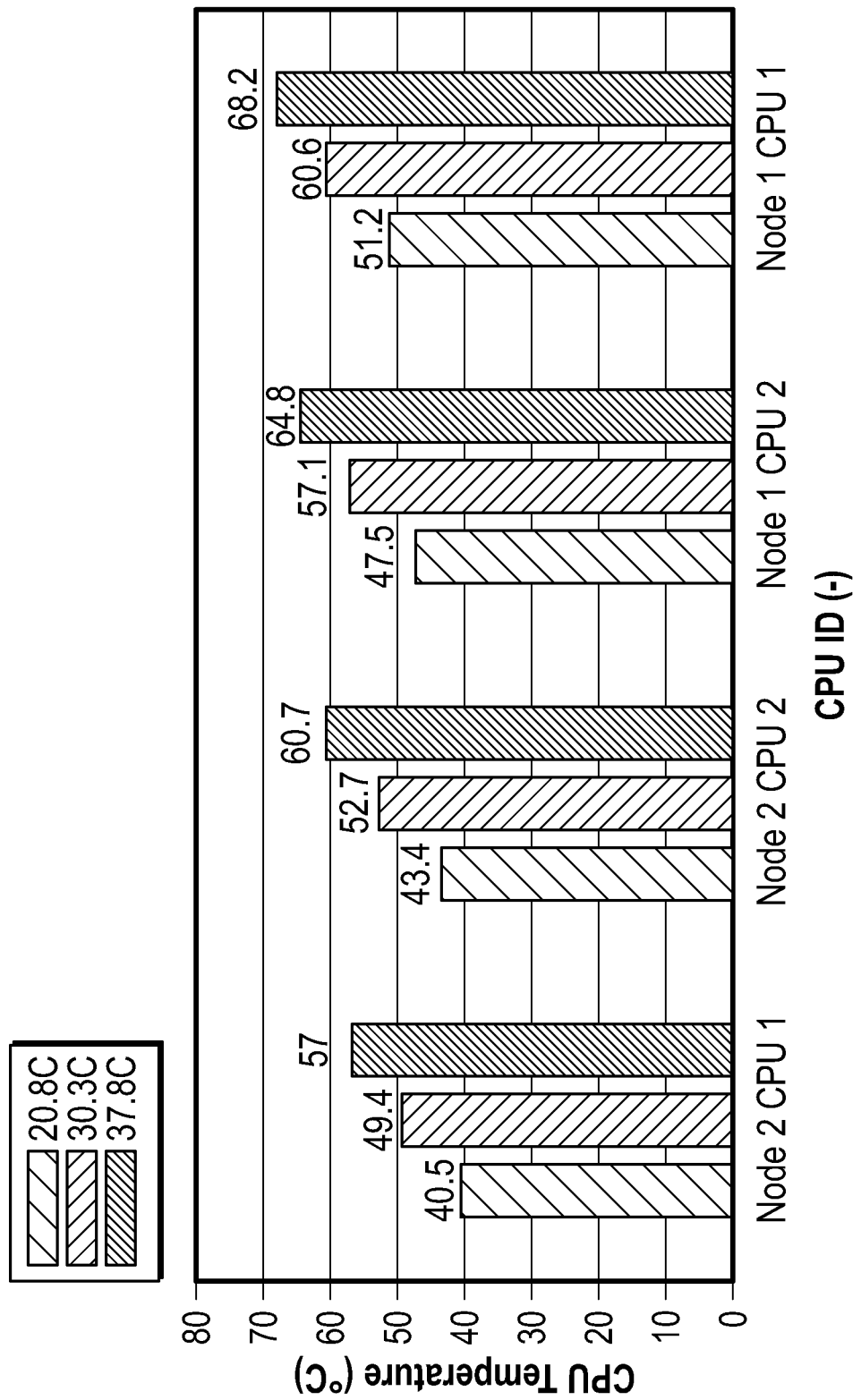

FIG. 10A-FIG. 10B present measured temperatures at various points in the liquid loop of an actual test implementation of a compute device such as the compute device 900 in FIG. 9. In this test implementation, the temperature controlled liquid was a 25% propylene glycol/water mix and was flowed through the liquid loop at a rate of 0.2 gpm ("gallons per minute"). Three separate cooling trials were performed with starting temperatures of 20.8 C, 30.3 C, and 37.8 C for the temperature controlled liquid. The processing resources were CPUs with a thermal design power ("TDP") of 225 W and the DIMMs had a TDP of ~5 W. The maximum case temperature for the DIMMs was ~78 C and for the CPUs was 68.2 C.

FIG. 10A presents the maximum location temperatures at points 1, 3-4, 6-7, 9-10, and 12 shown in FIG. 9 in the tested liquid loop. Note that, in each trial, the DIMM temperatures remained lower than the specified maximum case temperature for the DIMMs even though four compute subassemblies were cooled in series. Similarly, FIG. 10B presents the maximum location temperatures for the CPUs at locations 2, 5, 8, and 11. Once again, the maximum location temperatures remained below the maximum case temperature of the CPUs. Similar results were obtained for voltage regulators in the compute subassemblies even though such results are not presented.

Note also that these results were obtained in an implementation cooling four compute subassemblies in series. Commonly seen conventional approaches cool, at most, two compute subassemblies. The presently disclosed approach can therefore replace two conventional cooling subsystems and provide thermal control for two compute nodes or a single compute device.

The presently disclosed approach furthermore employs a low flow rate relative to conventional approaches even when providing thermal control for as many as four compute subassemblies. The lower flow rate uses lower pumping power through reduced pressure drop, thereby resulting in lower overall power consumption. The lower flow rate also leaves more temperature controlled liquid available to cool other devices in the system such as switches or storage devices. These devices have lower maximum temperature requirements and therefore benefit from having more available flow.

Furthermore, the currently disclosed approach is low cost and lightweight because of the thermal control plate's design. The anisotropically thermally conductive plastic is lightweight and low cost relative to metal parts. These savings are leveraged because implementations include at least three such thermal control plates—one for each compute subassembly.

The presently disclosed approach is also fanless. This reduces issues associated with vibration that may be introduced by fans. The absence of fans also saves weight through their omission and the concomitant omission of baffles and other structures that may be used to direct the forced air. Fans also consume power, so their absence also reduces power consumption. Eliminating fans reduces capital expenses by eliminating the fan parts and associated infrastructure (fan controls, baffling, wiring, fan housings). Eliminating fans reduces operational expenses by reducing power consumption. Since fans can fail, they must be a field replaceable part, and so eliminating fans reduces our FRU cost (field replaceable unit cost). Eliminating fans also increases system reliability by eliminating one of the parts that can fail.

The current approach also provides not only cooling but also heating. As discussed above, there are some environments where compute devices need to be warmed to operate properly. Compute devices, once warmed and engaged in operations, may also need cooling. The presently disclosed approach can address both needs in a compute system in some examples.

Figure 11:
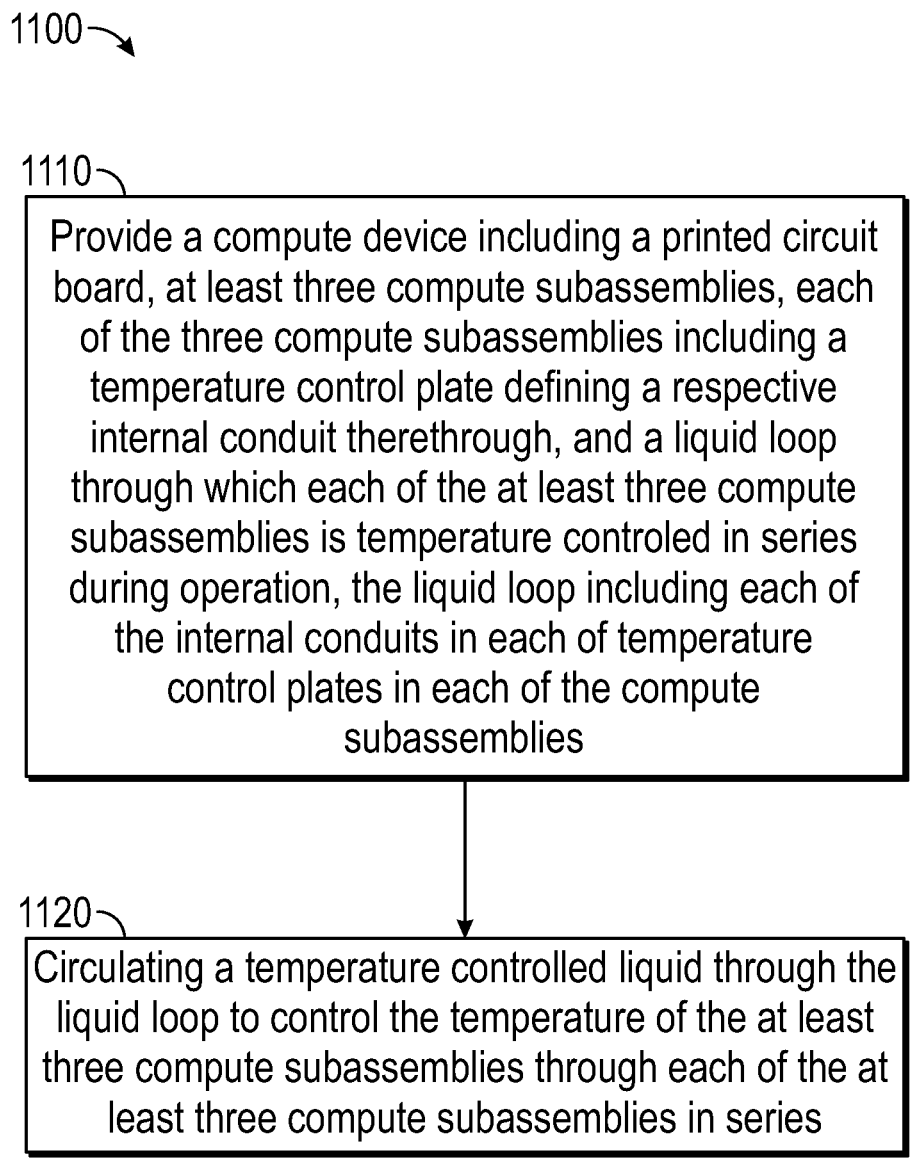
FIG. 11 illustrates a method for controlling the temperature of at least three compute subassemblies in series in accordance with one or more examples.

FIG. 11 illustrates a method 1100 for controlling the temperature of at least three compute subassemblies in series in accordance with one or more examples. The method 100 begins by providing (at 1110) a compute device. As used herein, to "provide" an item means to have possession of and/or control over the item. This may include, for example, forming (or assembling) some or all of the item from its constituent materials and/or, obtaining possession of and/or control over an already-formed item.

The provided compute device includes a printed circuit board, at least three compute subassemblies, and a liquid loop. The at least three compute subassemblies each include a thermal control plate defining a respective internal conduit therethrough. Each of the at least three compute subassemblies is temperature controlled in series during operation using the liquid loop. The liquid loop includes each of the internal conduits in each of the thermal control plates in each of the compute subassemblies.

The method 1100 continues (at 1120) by circulating a temperature controlled liquid through the liquid loop to control the temperature of the at least three compute subassemblies through each of the at least three compute subassemblies in series. In some examples, the method 1100 may include cooling the temperature controlled liquid prior to circulating and then cooling the at least three computing subassemblies to a desired temperature. Other examples may include heating the temperature controlled liquid prior to circulating and then heating the at least three computing subassemblies to a desired temperature.

Still other examples may include both cooling the at least three compute subassemblies to a desired temperature and heating at least three compute subassemblies to a desired temperature. The temperature to which the compute subassemblies are cooled may be different than or the same as the temperature to which they are heated. The combination of cooling and heating in this manner can be used to maintain the temperature of the at least three compute subassemblies at some desired temperature or within some desired range of temperatures.

More particularly, most electronic components have specifications for ranges of operating temperatures. Thus, the method 1100 can be used to cool, heat, or both cool and heat the compute assemblies to a desired temperature range. For instance, a specification might call for a component of a compute subassembly to be cooled below a certain maximum temperature so that the desired range might be any temperature below the specified maximum temperature. Alternatively, a specification might call for a component of a compute subassembly to be heated above a certain minimum temperature so that the desired range might be any temperature above the specific minimum temperature. More typically, though, specifications usually include a maximum and a minimum temperature so that the desired range may be bounded by the specified maximum and minimum temperature.

Note that in some examples the components of the compute subassemblies may need to be both heated and cooled. For instance, a compute device may be deployed into an environment in which ambient conditions drive the temperature of the electronic components below their specified minimum temperature. The method 1100 may then be used to heat the compute subassemblies as described above. In some of these examples, once warmed, the compute subassemblies may then need to be cooled. The method 1100 may then be used to cool the compute subassemblies. Accordingly, the method 1100 may therefore be used to both heat and cool in some examples.

Those in the art will appreciate that the temperature controlled liquid may also need to be heated or cooled prior to being circulated through the at least three compute subassemblies as described above. The temperature controlled liquid is provided to the compute device—and, hence, the at least three compute subassemblies—from a source off board. As discussed above, the compute device may be a part of a larger computing apparatus such as a server. A thermal control subsystem may be located offboard somewhere in the chassis, rack, row, or data center that circulates the temperature control liquid to the compute device. This same thermal control system may heat or cool the temperature controlled liquid as desired to heat, cool, or both heat and cool the compute subassemblies.

Figure 12A:
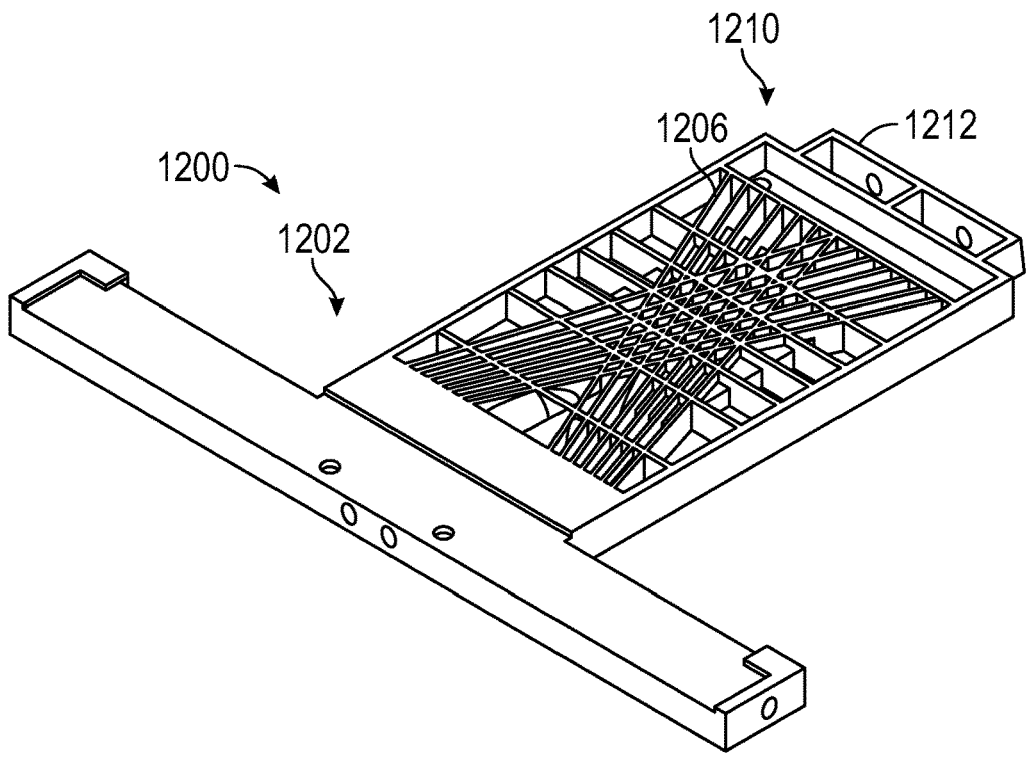
FIG. 12A-FIG. 12D illustrate a thermal control plate in accordance with one or more examples.
Figure 12B:
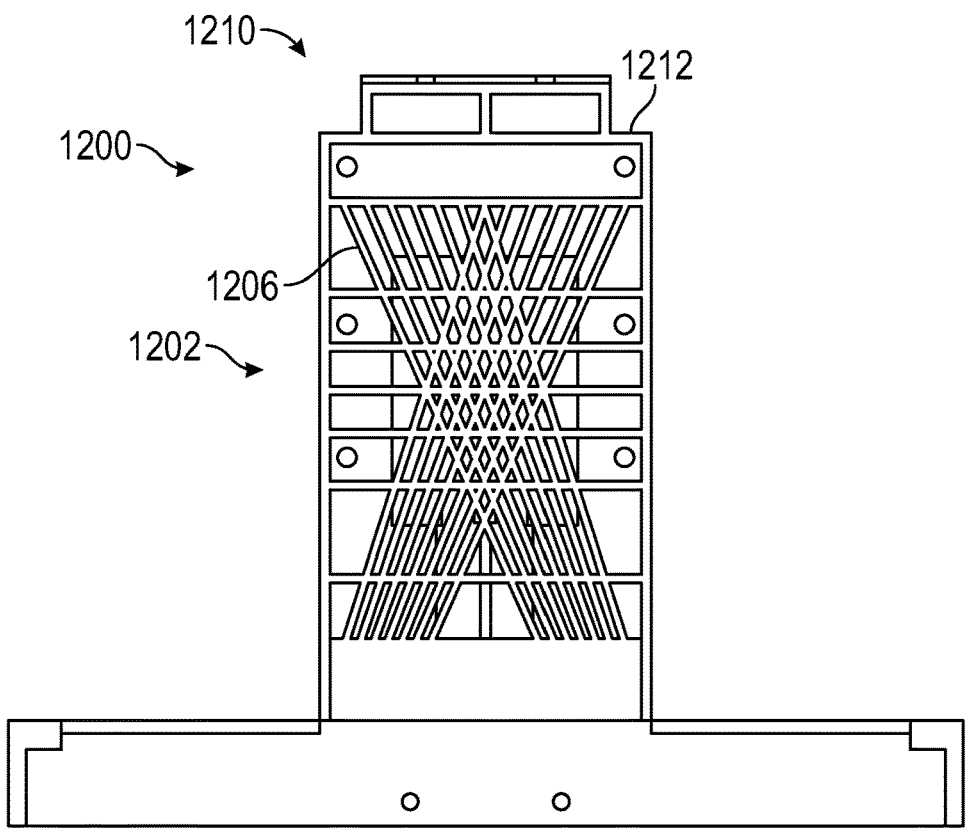
Figure 12C:
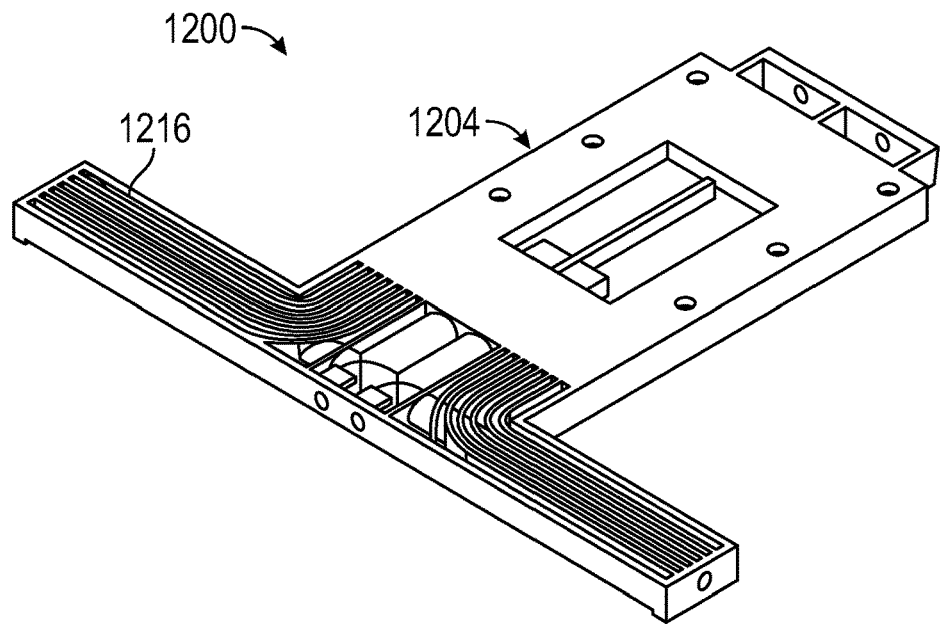
Figure 12D:
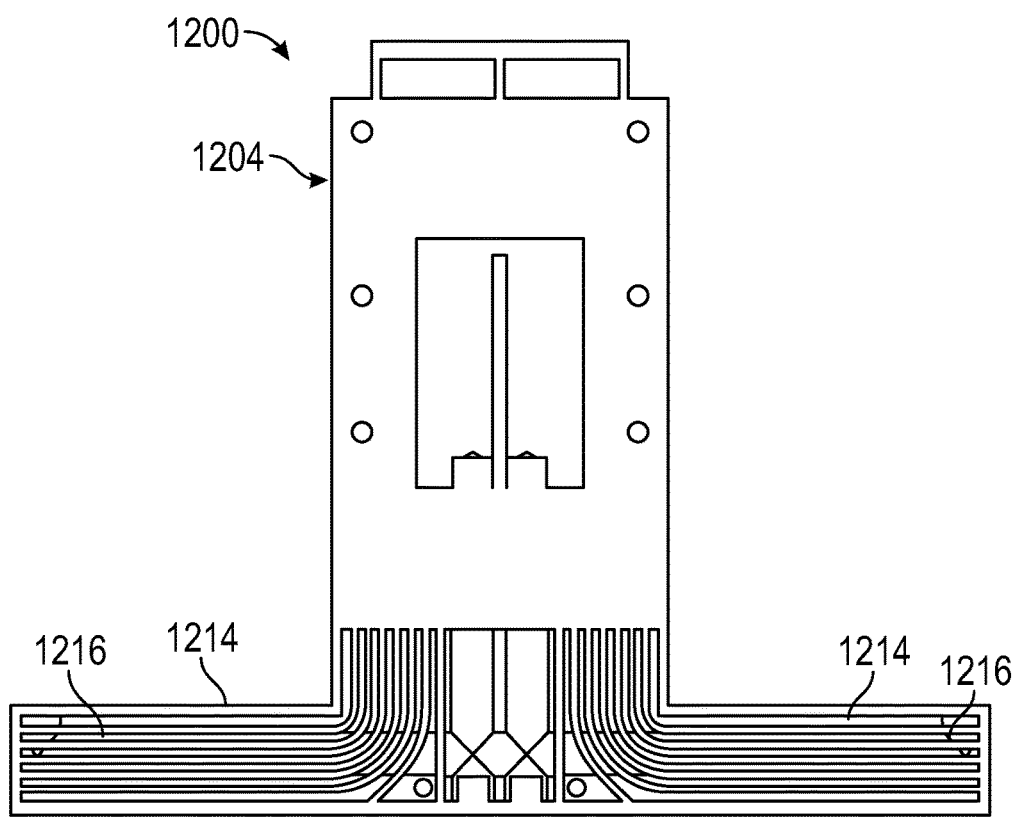

FIG. 12A-FIG. 12D illustrate a thermal control plate 1200 in accordance with one or more examples. FIG. 12A-FIG. 12B are a perspective and a plan view of a first side 1202 of the thermal control plate 1200. FIG. 12C-FIG. 12D are a perspective and a plan view of a second side 1204 of the thermal control plate 1200. As shown in FIG. 12A-FIG. 12B, the thermal control plate 1200 differs from the thermal control plate 106 in that the ribs 1206 (only one indicated) are fabricated in a different pattern. The end 1210 of the plate body 1212 is, in some examples, also designed differently. And, as shown in FIG. 12C-FIG. 12D, the thermal control plate 1200 includes a plurality of ribs 1216 fabricated over the first section 1214 of the internal conduit.

In particular, there are several features in the thermal control plate 1200 that "enhance" the desired heat transfer relative to the thermal control plate 300 shown in FIG. 3A-FIG. 3D. The ribs 1206 are preponderantly and generally aligned in the plastic flow direction $F_p$ (i.e., down the length of the plate body 1212) in the direction of the highest thermal conductivity as opposed to the ribs 310 in FIG. 3$k$ More particularly, the mold used to fabricate the thermal control plate 1200 is designed to force the plastic to flow in the direction of the ribs 1206. The parallel and orthogonal gridwork structure of the ribs 310 is also less efficient than the diagonal orientation of the ribs 1206. The ribs 1206 are also more numerous and thinner relative to the ribs 310, which promote heat transfer as well.

Some examples (not shown) may also incorporate additional features to enhance thermal transfer between the thermal control plate and the temperature controlled liquid. For example, some examples might use finned inserts in the first section of the internal conduit as is described in U.S. Pat. No. 10,813,249. Use of the finned inserts improved the cooling properties of an implementation such as that shown in FIG. 9 in computational flow dynamics models.

Figure 13A:
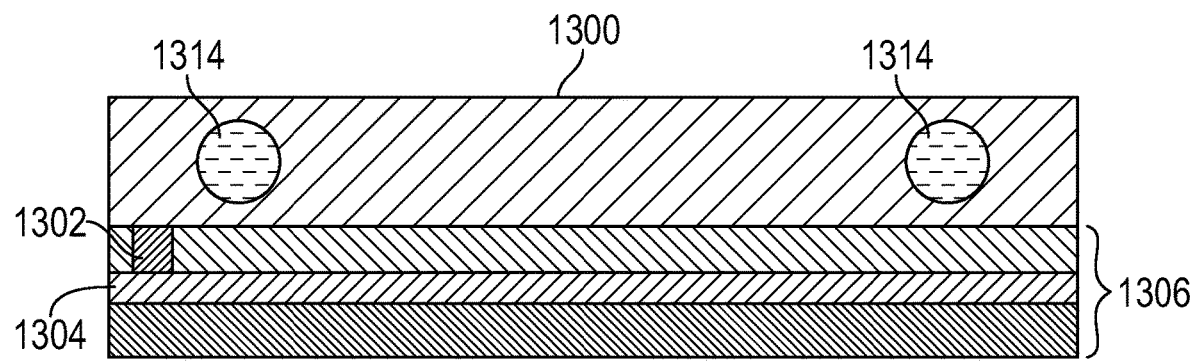
FIG. 13A-FIG. 13B are sectioned, plan side views of a thermal control plate thermally coupled to a thermally conductive plane of a printed circuit board in accordance with one or more examples.
Figure 13B:
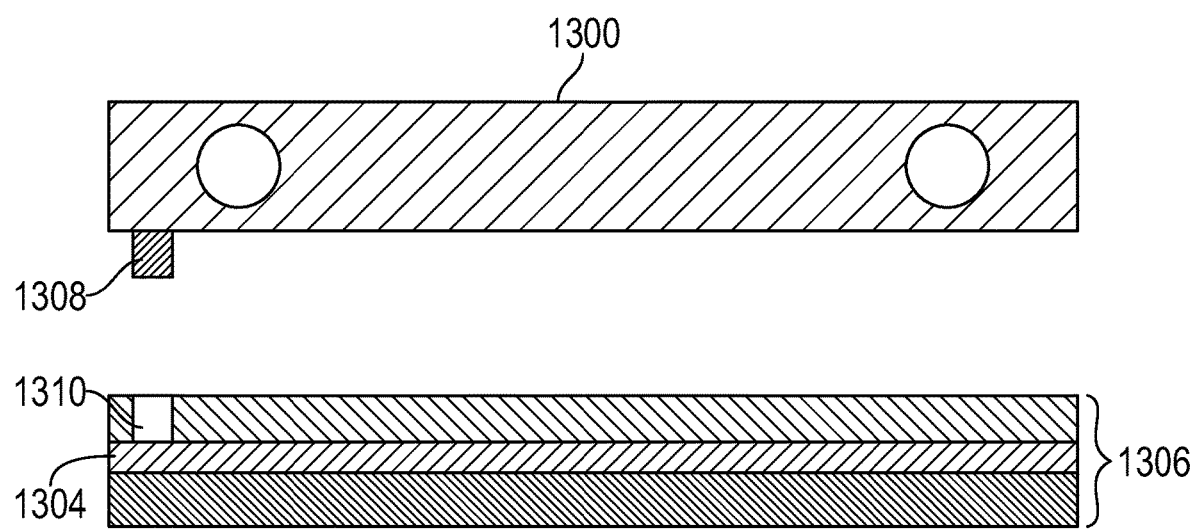

FIG. 13A-FIG. 13B are sectioned, plan side views of a thermal control plate 1300 thermally coupled through direct thermal contact 1302 to a thermally conductive plane 1304 of a printed circuit board 1306 in accordance with one or more examples. More particularly, FIG. 13A is an assembled view and FIG. 13B is an exploded view and both FIG. 13A-FIG. 13B are conceptualizations. As best shown in FIG. 13B, the direct thermal contact 1302 is implemented by a pin 1308 extending through a thermal via 1310 to physically contact the thermally conductive plane 1304. The pin 1308 may be formed integrally with the plate body 1312 during the fabrication process described above. In this manner, heat transferring from the electronic components (not shown) of the computer subassemblies (also not shown) into the printed circuit board 1306 may be transferred out using the temperature controlled liquid 1314 through the thermal via 1310.

This concludes the detailed description. The particular examples disclosed above are illustrative only, as the technique disclosed herein may be modified and practiced in different but equivalent manners apparent to those skilled in the art having the benefit of the teachings herein. Furthermore, no limitations are intended to the details of construction or design herein shown, other than as described in the claims below. It is therefore evident that the particular examples disclosed above may be altered or modified and all such variations are considered within the scope and spirit of the appended claims. Accordingly, the protection sought herein is as set forth in the claims below.

What is claimed:

1. A thermal control apparatus, comprising:
   a thermal control plate fabricated of an anisotropically thermally conductive plastic having a higher thermal conductivity in a plastic flow direction than in a cross-plastic flow direction, including a plurality of ribs on at least one side thereof, and at least partially defining an internal conduit through which a temperature controlled liquid flows when in operation;
   a heat transfer plate thermally coupled with at least a portion of the thermal control plate; and
   a plurality of heat transfer devices thermally coupled to the thermal control plate through the heat transfer plate.

2. The thermal control apparatus of claim 1, wherein the plastic flow direction is a planar direction and the cross-plastic flow direction is a cross-planar direction.

3. The thermal control apparatus of claim 1, wherein the heat transfer plate is a metal heat transfer plate.

4. The thermal control apparatus of claim 1, wherein the heat transfer plate is fastened to the thermal control plate.

5. The thermal control apparatus of claim 1, wherein the thermal control plate includes:
   a plate body having a first side and a second side, the plate body defining the ribs on the first side, a cavity in the second side, and a first section of the internal conduit;
   a pair of plate arms formed integrally with the plate body at a first end of the plate body and extending from the plate body, the plate arms defining a second section of the internal conduit;
   a thermal transfer plate defining a plurality of surface extensions on one side thereof to define a second section of the internal conduit when the thermal transfer plate is mated to the second side of the plate body over the cavity, the surface extensions directing fluid flow through the cavity; and
   a sealing element to seal the mating of the thermal transfer plate to the second side of the plate body.

6. The thermal control apparatus of claim 5, wherein the thermal control plate further includes:
   a pair of fittings, one of the pair of fittings at each end of the second section of the internal conduit; and
   a pair of brackets, one of the pair of brackets fitting over a respective one of the pair of fittings.

7. The thermal control apparatus of claim 5, wherein the plate arms each define a lip into which the heat transfer plate slides before being fastened to the plate body during assembly.

8. The thermal control apparatus of claim 1, wherein the heat transfer devices include heat pipes.

9. A compute device, comprising:
- a printed circuit board;
- at least three compute subassemblies disposed on the printed circuit board, each of the three compute subassemblies including a thermal control plate defining a respective internal conduit therethrough, wherein the thermal control plate is thermally coupled with the processing resource, and fabricated of an anisotropically thermally conductive plastic; and
- a liquid loop through which each of the at least three compute subassemblies is temperature controlled in series during operation, the liquid loop including each of the internal conduits in each of the thermal control plates in each of the compute subassemblies.

10. The compute device of claim 9, wherein each of the at least three compute subassemblies further includes:
- a processing resource disposed on the printed circuit board to which the thermal control plate is thermally coupled;
- a plurality of memory modules disposed on the printed circuit board and flanking the processing resource; and
- a heat transfer plate thermally coupled with at least a portion of the thermal control plate and to the plurality of memory modules.

11. The compute device of claim 10, wherein each of the at least three compute subassemblies further includes a plurality of heat transfer devices thermally coupled to the plurality of memory modules and to the heat transfer plate to thermally couple the plurality of memory modules and the heat transfer plate.

12. The compute device of claim 11, wherein the plurality of heat transfer devices comprises a plurality of heat pipes.

13. The compute device of 9, wherein:
- the printed circuit board includes an embedded thermally conductive plane; and
- the thermal control plate is thermally coupled to the embedded thermally conductive plane of the printed circuit board.

14. A method for controlling the temperature of an electronic component, the method comprising:
- providing a compute device, the compute device including:
  - a printed circuit board;
  - at least three compute subassemblies, each of the three compute subassemblies including a thermal control plate defining a respective internal conduit therethrough, wherein the thermal control plate is thermally coupled with the processing resource, the thermal control plate fabricated of an anisotropically thermally conductive plastic;
  - a liquid loop through which each of the at least three compute subassemblies is temperature controlled in series during operation, the liquid loop including each of the internal conduits in each of the thermal control plates in each of the compute subassemblies; and
- circulating a temperature controlled liquid through the liquid loop to control the temperature of the at least three compute subassemblies through each of the at least three compute subassemblies in series.

15. The method of claim 14, further comprising:
- heating the temperature controlled liquid prior to circulating the temperature controlled liquid through the liquid loop; and
- wherein:
- circulating the temperature controlled liquid through the liquid loop includes circulating the heated temperature controlled liquid to heat the at least three computing assemblies to at least a desired temperature range.

16. The method of claim 14, further comprising:
- cooling the temperature controlled liquid prior to circulating the temperature controlled liquid through the liquid loop; and
- wherein:
- circulating the temperature controlled liquid through the liquid loop includes circulating the cooled temperature controlled liquid to cool the at least three computing assemblies to at least a desired temperature range.

17. The method of claim 14, further comprising:
- heating the temperature controlled liquid prior to circulating the temperature controlled liquid through the liquid loop; and
- wherein:
- circulating the temperature controlled liquid through the liquid loop includes circulating the heated temperature controlled liquid to heat the at least three computing assemblies to at least the desired temperature range.

18. The method of claim 14, wherein each of the at least three compute subassemblies further includes:
- a processing resource disposed on the printed circuit board;
- a plurality of memory modules disposed on the printed circuit board and flanking the processing resource; and
- a heat transfer plate thermally coupled with at least a portion of the thermal control plate and to the plurality of memory modules.

19. The method of claim 18, wherein each of the at least three compute subassemblies further includes a plurality of heat transfer devices thermally coupled to the plurality of memory modules and to the heat transfer plate to thermally couple the plurality of memory modules and the heat transfer plate.

20. The method of 14, wherein:
- the printed circuit board includes an embedded thermally conductive plane; and
- the thermal control plate is thermally coupled to the embedded thermally conductive plane of the printed circuit board.

* * * * *